United States Patent
Choi et al.

(10) Patent No.: US 11,634,627 B2
(45) Date of Patent: Apr. 25, 2023

(54) METHOD FOR MANUFACTURING QUANTUM DOT FILM COMPRISING ENCAPSULATED QUANTUM DOTS UNIFORMLY DISPERSED THEREIN, QUANTUM DOT FILM MANUFACTURED THEREBY AND WAVELENGTH CONVERSION SHEET AND DISPLAY COMPRISING SAME

(71) Applicant: INNO QD CO., LTD, Yongin-si (KR)

(72) Inventors: Jae Gyun Choi, Yongin-si (KR); Oh Kwan Kwon, Anyang-si (KR); Jong Uk Bu, Seongnam-si (KR); Chul Park, Yongin-si (KR)

(73) Assignee: INNO QD CO., LTD, Yongin-si (KR)

( * ) Notice: Subject to any disclaimer, the term of this patent is extended or adjusted under 35 U.S.C. 154(b) by 302 days.

(21) Appl. No.: 16/763,294

(22) PCT Filed: Nov. 8, 2018

(86) PCT No.: PCT/KR2018/013544
§ 371 (c)(1),
(2) Date: Jun. 30, 2020

(87) PCT Pub. No.: WO2019/098601
PCT Pub. Date: May 23, 2019

(65) Prior Publication Data
US 2021/0024820 A1      Jan. 28, 2021

(30) Foreign Application Priority Data

Nov. 14, 2017 (KR) .................. 10-2017-0151330
Nov. 14, 2017 (KR) .................. 10-2017-0151337
(Continued)

(51) Int. Cl.
*C09K 11/02* (2006.01)
*C09K 11/88* (2006.01)
(Continued)

(52) U.S. Cl.
CPC ...... *C09K 11/025* (2013.01); *B29D 11/00788* (2013.01); *B32B 27/06* (2013.01);
(Continued)

(58) Field of Classification Search
CPC ......... C09K 11/025; C09K 11/883; C08J 5/18
See application file for complete search history.

(56) References Cited

U.S. PATENT DOCUMENTS 203,554 A    5/1878    Oldrieve
8,957,401 B2  2/2015  Pickett et al.
(Continued)

FOREIGN PATENT DOCUMENTS

JP    2013-505347    2/2013
JP    2016-111292    6/2016
(Continued)

OTHER PUBLICATIONS

KR20140060215A_machine translation, May 2014 (Year: 2014).*
KIPO, Office Action of KR 10-2018-0059197 dated Jul. 30, 2018.

*Primary Examiner* — Tracie Y Green
(74) *Attorney, Agent, or Firm* — Lex IP Meister, PLLC

(57) ABSTRACT

The present invention relates to a method of manufacturing a quantum-dot film having encapsulated quantum dots dispersed therein, in which quantum dots are uniformly dispersed in a matrix resin to thus increase quantum yield and in which deterioration of the quantum dots can be prevented through encapsulation, a quantum-dot film manufactured thereby, and a wavelength conversion sheet and a display including the same.

13 Claims, 7 Drawing Sheets

(30) Foreign Application Priority Data

Mar. 3, 2018 (KR) ........................ 10-2018-0025500
May 24, 2018 (KR) ........................ 10-2018-0059197

(51) Int. Cl.

| | | |
|---|---|---|
| *C08L 75/14* | (2006.01) | |
| *C08J 5/18* | (2006.01) | |
| *G02F 1/13357* | (2006.01) | |
| *B32B 27/06* | (2006.01) | |
| *B32B 27/18* | (2006.01) | |
| *B29D 11/00* | (2006.01) | |
| *G02F 1/1335* | (2006.01) | |
| *B82Y 20/00* | (2011.01) | |
| *B82Y 40/00* | (2011.01) | |

(52) U.S. Cl.
CPC ................ *B32B 27/18* (2013.01); *C08J 5/18* (2013.01); *C08L 75/14* (2013.01); *C09K 11/883* (2013.01); *G02F 1/1336* (2013.01); *B32B 2264/025* (2013.01); *B32B 2264/0292* (2013.01); *B32B 2264/107* (2013.01); *B32B 2264/402* (2020.08); *B32B 2264/403* (2020.08); *B32B 2264/501* (2020.08); *B32B 2307/40* (2013.01); *B32B 2457/20* (2013.01); *B32B 2551/00* (2013.01); *B82Y 20/00* (2013.01); *B82Y 40/00* (2013.01); *C08J 2375/14* (2013.01); *C08J 2483/04* (2013.01); *C08L 2203/20* (2013.01); *C08L 2205/20* (2013.01); *G02F 1/133614* (2021.01); *G02F 2202/106* (2013.01); *G02F 2202/36* (2013.01)

(56) References Cited

U.S. PATENT DOCUMENTS

| | | | |
|---|---|---|---|
| 9,884,992 | B2 | 2/2018 | Choi et al. |
| 10,032,964 | B2 | 7/2018 | Pickett et al. |
| 10,131,177 | B2 * | 11/2018 | Knipp .................... B32B 27/08 |
| 2015/0285444 | A1 | 10/2015 | Choi et al. |
| 2015/0301257 | A1 | 10/2015 | Choi et al. |
| 2016/0068749 | A1 | 3/2016 | Kwon et al. |
| 2016/0161065 | A1 | 6/2016 | Sung et al. |
| 2017/0160431 | A1 | 6/2017 | You et al. |
| 2017/0277002 | A1 | 9/2017 | Yamada et al. |
| 2021/0269709 | A1 * | 9/2021 | Choi ....................... B01J 13/18 |

FOREIGN PATENT DOCUMENTS

| | | |
|---|---|---|
| KR | 10-2013-0027317 | 3/2013 |
| KR | 10-2014-0060215 | 5/2014 |
| KR | 101396871 | 5/2014 |
| KR | 10-2016-0069393 | 6/2016 |
| KR | 10-2017-0024745 | 3/2017 |
| KR | 10-2017-0049851 | 5/2017 |
| KR | 10-2017-0065736 | 6/2017 |
| KR | 10-2017-0092934 | 8/2017 |
| KR | 10-1909541 | 10/2018 |

\* cited by examiner (a)     (b)

METHOD FOR MANUFACTURING QUANTUM DOT FILM COMPRISING ENCAPSULATED QUANTUM DOTS UNIFORMLY DISPERSED THEREIN, QUANTUM DOT FILM MANUFACTURED THEREBY AND WAVELENGTH CONVERSION SHEET AND DISPLAY COMPRISING SAME

CROSS REFERENCE TO RELATED APPLICATION

The present application claims priority to Korean Patent Application Nos. 10-2017-0151330 and 10-2017-0151337, filed on Nov. 14, 2017, 10-2018-0025500, filed on Mar. 3, 2018, and 10-2018-0059197 filed on May 24, 2018, the entire contents of which are incorporated herein for all purposes by this reference.

TECHNICAL FIELD

The present invention relates to a method of manufacturing a quantum-dot film having encapsulated quantum dots dispersed therein, and a wavelength conversion sheet and a display including the quantum-dot film manufactured thereby.

BACKGROUND ART

Quantum dots (QDs) are ultrafine semiconductor particles having a size corresponding to ones of nanometers. When exposed to light, quantum dots emit light of a specific frequency due to the process in which electrons in an unstable state jump down from the conduction band to the valence band.

Typically, quantum dots generate light at shorter wavelengths with a decrease in the particle size thereof and emit light at longer wavelengths with an increase in the particle size thereof. Therefore, when the size of quantum dots is adjusted, visible light at a desired wavelength may be expressed, and various colors may be simultaneously implemented using quantum dots having different sizes. Accordingly, quantum dots are receiving attention as a next-generation light source because it is possible to realize a desired natural color by controlling the size of quantum dots, and also because of the good color gamut and good luminance thereof.

Quantum dots are formed into a film and then a barrier film is disposed on both sides of the film to afford a wavelength conversion sheet, which is then applied to a backlight unit for a liquid crystal display (LCD). When blue light radiated from the backlight unit passes through the quantum-dot sheet, red quantum dots are converted to red and green quantum dots are converted to green to emit light, and blue light is radiated without change, so a full color range may be realized. The display using such QDs is advantageous in that combinations of blue, green, and red close to natural light are possible, and thus a wide range of colors that are close to natural light and cannot be shown by existing fluorophores may be exhibited.

A conventional quantum-dot film is manufactured in a manner in which quantum dots are mixed with a curable resin and then formed into a coating film. Since the quantum dots have a size corresponding to ones of nanometers, aggregation thereof occurs, making it difficult to uniformly disperse QDs in the curable resin, and thus light emission uniformity is greatly reduced. In particular, when quantum dots come into contact with moisture or air (i.e. oxygen) penetrating from the outside, light conversion efficiency may rapidly decrease, and the lifetime of the display may be reduced.

Moreover, a wavelength conversion sheet is manufactured in the form of a multilayer structure. In the case in which adhesion between the quantum-dot film and the barrier film is low, the penetration of moisture and air becomes easier, so the quantum-dot film is peeled from the barrier film and the quantum dots are oxidized, which is undesirable.

This problem may be overcome by encapsulating quantum dots with a hydrophobic resin, but the hydrophobic resin exhibits low adhesion to the barrier film, which creates another problem.

Recently, in order to realize uniform dispersion of quantum dots and adhesion to a barrier film, there are proposed methods in which quantum dots are granulated in an encapsulated form and the encapsulated quantum dots are dispersed in a matrix resin, which is a resin that strongly adheres to a barrier film. However, the quantum-dot film thus manufactured is problematic in that quantum dots may aggregate when encapsulated, and thus luminous efficiency is lowered due to the very wide particle size distribution thereof.

Hence, methods using emulsions have been devised.

Korean Patent Application Publication Nos. 10-2016-0069393 and 10-2013-0027317 disclose the preparation of an emulsion due to a polar/nonpolar difference by dispersing a hydrophobic polymer, quantum dots and hydrophobic toluene in a polar solvent such as water. Subsequently, the solvent is removed from the emulsion to afford quantum-dot/polymer beads in a powder phase, which are then mixed with an acrylic monomer to afford a colloid, which is then cured, thereby manufacturing a quantum-dot film. This method has been noted to be capable of manufacturing encapsulated quantum dots having a uniform size by separately performing encapsulation and curing, but when removing the solvent (water, toluene, etc.), aggregation of quantum-dot/polymer beads occurs, and it is difficult to manufacture substantially uniform particles due to low dispersibility in the acrylic monomer. Moreover, processes including removal of the solvent, acquisition of the powder, etc., are complicated and costs increase, which is undesirable.

Accordingly, Korean Patent Application Publication No. 10-2017-0092934 discloses an emulsion configured to include an inner phase including a hydrophobic polymer and quantum dots and an outer phase including an acrylic resin. In order to manufacture a quantum-dot film, the emulsion is applied on a substrate, followed by ultraviolet curing once using a mercury lamp. This method is advantageous because the manufacturing process is simple, but coalescence between droplets constituting the inner phase occurs when ultraviolet curing is performed only once, so the encapsulation of quantum dots cannot be stably achieved.

CITATION LIST

Korean Patent Application Publication No. 10-2016-0069393 (Jun. 16, 2016), Method of manufacturing light conversion composite, light conversion composite, and light conversion sheet, backlight unit and display including the same Korean Patent Application Publication No. 10-2013-0027317 (Mar. 15, 2013), Quantum-dot complex and method of manufacturing the same Korean Patent Application Publication No. 10-2017-0092934 (Aug. 14, 2017), Composition for optical film and optical film including the same

DISCLOSURE

Technical Problem

Accordingly, the present inventors have continuously conducted research in order to solve the aforementioned problems in various ways, designed compositions in emulsion forms, and ascertained that curing the inner phase and the outer phase of the emulsion in different ways is advantageous in various aspects such as dispersibility of quantum dots, uniformity of particles, convenience in processing, adhesion to barrier films, and the like, and thus the properties of the obtained quantum-dot film and wavelength conversion sheet may be improved.

Therefore, an objective of the present invention is to provide a method of manufacturing a quantum-dot film using a curable emulsion composition and a quantum-dot film manufactured thereby.

Another objective of the present invention is to provide a wavelength conversion sheet including the quantum-dot film and a display including the same.

Technical Solution

In order to accomplish the above objectives, the present invention provides a method of manufacturing a quantum-dot film suitable for manufacturing a quantum-dot film in which encapsulated particles, obtained by encapsulating quantum dots with an encapsulation resin, are dispersed in a matrix resin, the method including:

preparing a curable emulsion composition including an inner phase including quantum dots and an encapsulation resin and an outer phase including a photocurable polymerization compound and a photoinitiator, the inner phase being dispersed in a droplet form in the outer phase; and independently performing encapsulation of the inner phase and curing of the outer phase using the curable emulsion composition.

Here, the encapsulation resin may be a thermally curable resin or a wax-based compound.

According to an embodiment of the present invention, the encapsulation resin may be a thermally curable resin, and the quantum-dot film may be manufactured in a manner in which the quantum dots of the inner phase are encapsulated with the encapsulation resin by applying heat and then the photocurable polymerization compound of the outer phase is cured through light irradiation.

According to another embodiment of the present invention, the encapsulation resin may be a liquid thermally curable resin, and the quantum-dot film may be manufactured in a manner in which the photocurable polymerization compound of the outer phase is cured through light irradiation and then the quantum dots of the inner phase are encapsulated with the encapsulation resin by applying heat.

According to still another embodiment of the present invention, the encapsulation resin may be a wax-based compound, and the quantum-dot film may be manufactured in a manner in which the temperature of the curable emulsion composition is lowered to a temperature equal to or lower than the melting point of the wax-based compound so that the quantum dots of the inner phase are encapsulated with the encapsulation resin, and the photocurable polymerization compound of the outer phase is cured through light irradiation.

Here, the curable emulsion composition may be prepared in a manner in which the quantum dots and the encapsulation resin are mixed at a temperature equal to or higher than the melting point of the wax-based compound to afford an inner phase, and the inner phase and the outer phase are mixed at a temperature equal to or higher than the melting point of the wax-based compound.

In addition, the present invention provides a wavelength conversion sheet configured such that the quantum-dot film is interposed between a pair of barrier films and a display including the same.

Advantageous Effects

According to the present invention, a curable emulsion composition is prepared using an emulsion, thus solving problems due to aggregation of quantum dots during conventional preparation processes, thereby making it possible to stably manufacture a quantum-dot film having quantum dots.

The quantum-dot film thus manufactured is configured such that quantum dots are uniformly dispersed at a high concentration in a matrix resin, thus increasing the conversion efficiency of quantum dots, preventing penetration of moisture or oxygen from the outside due to the encapsulation resin that encapsulates the quantum dots and the resin that constitutes the matrix resin, exhibiting high light transmittance and preventing the deterioration of quantum dots.

The quantum-dot film can be applied to a wavelength conversion sheet for a display, and is capable of realizing a high-quality screen.

BRIEF DESCRIPTION OF REFERENCE NUMERALS

Figure 1:
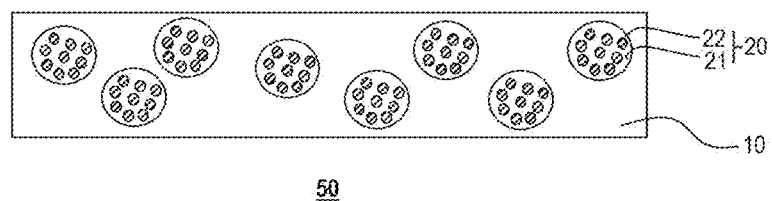
FIG. 1 is a cross-sectional view showing a quantum-dot film according to the present invention.

10: matrix resin
20: encapsulated particles
21: encapsulation resin
22: quantum dots
23: ceramic nanoparticles
50: quantum-dot film
60: first barrier film
70: second barrier film
100: wavelength conversion sheet

BEST MODE

FIG. 1 is a cross-sectional view showing a quantum-dot film according to the present invention.

As shown in FIG. 1, a quantum-dot film 50 is configured such that encapsulated particles 20, obtained by encapsulating quantum dots 22 with an encapsulation resin 21, are dispersed in a matrix resin 10.

The quantum-dot film 50 according to the present invention is configured such that the encapsulated particles 20 are uniformly dispersed in the matrix resin 10. In the manufacturing method therefor, a curable emulsion composition is prepared, in which encapsulation of the inner phase and photocuring of the outer phase are independently performed.

Curable Emulsion Composition

In the manufacture of a film using quantum dots, uniform dispersion of quantum dots is of critical importance. If quantum dots are not thoroughly dispersed in the film, there may occur a variation in color conversion from a macroscopic point of view, and quantum yield may significantly decrease owing to the energy transfer between quantum dots from a microscopic point of view.

According to the present invention, in order to manufacture the quantum-dot film 50 having the above structure, a curable emulsion composition in an emulsion form, in which an inner phase and an outer phase are present, is prepared, and encapsulation of the quantum dots 22 and curing of the matrix resin 10 in the emulsion are performed using different curing systems.

'Emulsion' may mean a layer configured such that any one of two or more phases that do not mix with each other forms an outer phase or a continuous phase in the layer and the remaining one thereof is dispersed in the outer phase to form an inner phase or a dispersed phase. Each of the inner phase and the outer phase may be a solid, semi-solid or liquid, and the inner phase and the outer phase may be the same as or different from each other. Typically, the term 'emulsion' is used for two or more liquids that do not mix with each other, but the emulsion in the present application is not necessarily an emulsion formed by two or more liquids.

The curable emulsion composition of the present invention includes an inner phase including the quantum dots and the encapsulation resin 21 and an outer phase including a photocurable polymerization compound for the preparation of the matrix resin 10, these phases being phase-separated from each other due to the hydrophobic/hydrophilic properties thereof.

Here, 'hydrophobic material' refers to a material exhibiting low intermolecular attraction to an aqueous solvent such as water, and the 'hydrophilic material' refers a material exhibiting high intermolecular attraction to an aqueous solvent such as water. As such, the criteria for distinguishing the hydrophobic material and the hydrophilic material from each other are not particularly limited, so long as they are phase-separated from each other to form individual regions.

The curable emulsion composition of the present invention is configured to include a hydrophobic region including the quantum dots 22 and the encapsulation resin 21 in a droplet state and a hydrophilic region including the photocurable polymerization compound, in which the two regions that do not mix with each other are separated from each other. Due to this phase separation, each of the inner phase and the outer phase may be independently cured. Moreover, since it is possible to cure the encapsulation resin 21 by adjusting the temperature (e.g. applying heat or removing heat) and to cure the matrix resin 10 through light irradiation, each of the encapsulation resin 21 and the matrix resin 10 may be stably cured.

In particular, the curable emulsion composition of the present invention is capable of using quantum dots 22 at a high concentration, and because the droplet size is constant, the encapsulated particles 20 obtained by encapsulating the quantum dots 22 with the encapsulation resin 21 have a uniform size.

Hereinafter, a specific composition of the curable emulsion composition is described in detail.

(i) Inner-Phase Composition

The 'inner-phase composition' refers to a composition that is discontinuously dispersed in the curable emulsion composition. The inner-phase composition serves to prepare encapsulated particles 20, and includes quantum dots 22 and the encapsulation resin 21.

Due to the quantum confinement effect, the quantum dots 22 absorb light emitted from a light source and then convert the wavelength of light having a wavelength corresponding to the band gap of the quantum dots 22 to emit light.

The quantum dots 22 may include a semiconductor selected from the group consisting of Group II-VI, III-V, IV-VI and IV semiconductors and mixtures thereof. More specifically, the quantum dots 22 may be particles having a monolayer or multilayer structure including one or more semiconductor crystals selected from the group consisting of, for example, CdS, CdO, CdSe, CdTe, $Cd_3P_2$, $Cd_3As_2$, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, $HgI_2$, AgI, AgBr, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, $GaInP_2$, InN, InP, InAs, InSb, $In_2S_3$, $In_2Se_3$, $TiO_2$, BP, Si, Ge and combinations thereof.

Also, the quantum dots 22 may include Group II-VI compound semiconductor nanocrystals such as CdS, CdSe, CdTe, ZnS, ZnSe, ZnTe, HgS, HgSe and HgTe, Group III-V compound semiconductor nanocrystals such as GaN, GaP, GaAs, InP and InAs, or mixtures thereof. The center particles may have a core/shell structure, and each of the core and shell of the center particles may include the above-listed compounds. The above-listed compounds may be included alone or in combinations of two or more thereof in the core or shell. For example, the center particles may have a CdSe—ZnS (core/shell) structure composed of a core including CdSe and a shell including ZnS.

In addition, the quantum dots 22 may have a core/shell structure or an alloy structure. The quantum dots 22 having a core/shell structure may grow a shell layer in various shapes by adding a different component upon growing a seed crystal structure. The formation of the core/shell structure is advantageous because not only properties such as high luminous efficiency and high luminous clarity but also other properties such as thermal stability or insulation performance may be satisfied. The quantum dots 22 having a core/shell structure or an alloy structure may be CdSe/ZnS, CdSe/ZnSe/ZnS, CdSe/CdSx(Zn1-yCdy)S/ZnS, CdSe/CdS/ZnCdS/ZnS, InP/ZnS, InP/Ga/ZnS, InP/ZnSe/ZnS, PbSe/PbS, CdSe/CdS, CdSe/CdS/ZnS, CdTe/CdS, CdTe/ZnS, $CuInS_2$/ZnS, or $Cu_2SnS_3$/ZnS.

Also, the quantum dots 22 may be perovskite nanocrystalline particles. Perovskite has the structure of $ABX_3$, $A_2BX_4$, $ABX_4$ or $A_{n-1}B_nX_{3n+1}$ (in which n is an integer of 2 to 6), in which A is an organic ammonium or alkali metal material, B is a metal material, and X is a halogen element.

The organic ammonium may be amidinium-based organic ions, $(CH_3NH_3)_n$, $((C_xH_{2x+1})_nNH_3)_2$ $(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2$ $(CF_3NH_3)_n$, $((C_xF_{2x+1})_nNH_3)_2$ or $(C_nF_{2n+1}NH_3)_2$) (in which n is an integer of 1 or more and x is an integer of 1 or more), and the alkali metal material may be Na, K, Rb, Cs or Fr. Also, B may be a divalent transition metal, a rare-earth metal, an alkaline earth metal, Pb, Sn, Ge, Ga, In, Al, Sb, Bi, Po or ion combinations thereof, and X may be Cl, Br, I ions or combinations thereof.

Also, the quantum dots may be doped perovskite nanocrystalline particles. The doped perovskite includes a structure of $ABX_3$, $A_2BX_4$, $ABX_4$ or $A_{n-1}B_nX_{3n+1}$ (in which n is an integer of 2 to 6), in which a portion of A is substituted with A', a portion of B is substituted with B', or a portion of X is substituted with X', A and A' being organic ammonium, B and B' being a metal material, and X and X' being a halogen element.

Here, A and A' may be amidinium-based organic ions, $(CH_3NH_3)_n$, $(C_xF_{2x+1})_nNH_3)_2$, $(CH_3NH_3)_n$, $(RNH_3)_2$, $(C_nH_{2n+1}NH_3)_2$, $(CF_3NH_3)$, $(CF_3NH_3)$ n, $(C_xF_{2x+1})_nNH_3)_2$ $(CF_3NH_3)_n$, $((C_xF_{2x+1})_nNH_3)_2$ or $(C_nF_{2n+1})NH_3)_2$ (in which n is an integer of 1 or more and x is an integer of 1 or more), B and B' may be divalent transition metal, rare-earth metal, alkaline earth metal, Pb, Sn, Ge, Ga, In, Al, Sb, Bi or Po, and X and X' may be Cl, Br or I.

The quantum dots 22 may have a spherical shape, an elliptical shape, a rod shape, a wire shape, a pyramid shape, a cube shape or other geometric or non-geometric shapes. These are usually spherical or elliptical nanoparticles and may have an average particle diameter of 1 nm to 10 nm, and the light emission wavelength varies depending on the size thereof, so quantum dots 22 having an appropriate size may be selectively used to afford light of a desired color. Typically, quantum dots 22 having a larger particle size emit light of quite low energy compared to quantum dots 22 made of the same material but having a smaller particle size. In the present invention, the quantum dots 22 may include at least one selected from the group consisting of, for example, quantum dots 22 that convert blue light into red light, quantum dots 22 that convert blue light into green light, and quantum dots 22 that convert green light into red light.

In particular, the quantum dots 22 are provided in the form of a colloid (or a suspension) by being dispersed in a solvent (e.g. toluene), and are provided in the form to which a ligand is attached for surface stabilization. Here, the ligand is a hydrophobic organic ligand that increases the dispersibility of quantum dots 22 and prevents the quantum dots from aggregating. The ligand may be removed before use, or may be substituted with another ligand and used. The ligand may prevent quantum dots 22 adjacent to each other from easily aggregating and being quenched. Moreover, the ligand is coupled with the quantum dots 22, so the quantum dots 22 become hydrophobic. Accordingly, when quantum dots 22 are dispersed in a coating layer or a resin for film formation, the use of quantum dots including the ligand is capable of improving dispersibility thereof in the resin compared to quantum dots 22 including no ligand. Examples of the ligand may include an amine-based compound having a C6-C30 alkyl group, a carboxylic acid compound, and the like. Examples of the amine-based compound having an alkyl group include hexadecylamine, octylamine, etc. As another example of the ligand, an amine-based compound having a C6-C30 alkenyl group, a carboxylic acid compound, or the like may be mentioned. Examples of the ligand may include phosphine compounds including trioctylphosphine, triphenylphosphine, t-butylphosphine, etc., phosphine oxides such as trioctylphosphine oxide, etc., pyridine, thiophene, and the like.

However, in the present invention, there is an advantage in that the quantum dots may be used without additional treatment. This is because a hydrophobic resin is used as the encapsulation resin 21.

The encapsulation resin 21 encapsulates a plurality of quantum dots 22 to thus achieve uniform dispersion of the quantum dots in the matrix resin 10. This resin is hydrophobic and is highly compatible with the quantum dots 22, and may be uniformly present in an inner phase together therewith. The encapsulation resin 21 is not particularly limited, so long as it is a hydrophobic resin, but a thermally curable or a wax-based compound may be used. These are compounds that may be solidified or cured by heat.

The thermally curable may be a liquid resin that is present as a liquid at room temperature, determined in the range of 20° C.±15° C. (5 to 35° C.), corresponding to "room temperature" defined in ISO 554-1976. The use of the liquid resin facilitates dispersion of the quantum dots 22.

The thermally curable is a resin that is capable of forming a three-dimensional network structure when heated, and includes both a thermally curable that is cured by heat and a room-temperature-curable resin in which curing is accelerated by heat.

The thermally curable may be at least one selected from the group consisting of a silicone-based resin, an epoxy resin, a petroleum resin, a phenol resin, a urea resin, a melamine resin, an unsaturated polyester resin, an amino resin, butyl rubber, isobutylene rubber, acrylic rubber, and urethane rubber, and is preferably a silicone-based resin or an epoxy resin.

Preferably, heat curing of the thermally curable may occur or may be accelerated in the range of room temperature to 125° C. For example, heat curing may occur or may be accelerated in the range from room temperature to 125° C. for a silicone-based resin, from room temperature to 120° C. for an epoxy resin, from 100° C. to 120° C. for a phenol resin, urea resin, melamine resin and amino resin, from 80° C. to 100° C. for an unsaturated polyester resin, and from 100° C. to 125° C. for butyl rubber, isobutylene rubber, acrylic rubber and urethane rubber.

Specifically, the silicone-based resin is a liquid siloxane polymer, and may be a linear silicone oil or a modified silicone oil depending on the type of organic material that is bound to the silicon atom and the degree of polymerization of siloxane. Representative examples of the linear silicone oil may include dimethyl silicone oil in which all organic groups are methyl, methylphenyl silicone oil having a phenyl group introduced thereto, such as methylphenyl silicone oil or diphenyl silicone oil, a copolymer of polysiloxane and diphenylsiloxane, methyl hydrogen silicone oil, and the like. The modified silicone oil is silicone oil having an organic group introduced thereto, in place of the methyl group or phenyl group, and examples thereof may include methylhydroxy silicone oil, fluorosilicone oil, polyoxyether copolymer, alkyl-modified silicone oil, higher-fatty-acid-modified silicone oil, amino-modified silicone oil, epoxy-modified silicone oil, etc. These silicones are liquid resin having a viscosity of 50 cps to 1000 cps at room temperature, have low surface tension, are nonpolar and thus soluble in aromatic solvents such as toluene, xylene, etc., and have low solubility in polar solvents such as water or alcohol.

Curing of the silicone-based resin occurs through a curing reaction mechanism selected from among a condensation reaction, an addition reaction, and a radical reaction. Here, depending on the curing system, there are one-component and two-component types, and in the two-component type, the main component and the curing agent or catalyst are packaged separately, and curing proceeds through mixing thereof. Here, the catalyst may be a platinum catalyst, and the curing agent may be organic peroxide.

For example, in the case of a silicone resin, the use of the curing agent may vary depending on the curing mechanism. In an exemplary embodiment, an addition reaction occurs in the presence of a platinum catalyst, or curing is achieved through a free radical reaction by applying heat and using organic peroxide. Here, examples of the organic peroxide include 2,4-dichlorobenzoyl peroxide, benzoyl peroxide, dicumyl peroxide, di-tert-butyl perbenzoate and 2,5-bis(tert-butylperoxy)benzoate. The organic peroxide is used at a concentration of 0.1 to 10 parts by weight, and preferably 0.2 to 5 parts by weight, based on 100 parts by weight of the silicone-based resin.

Examples of the epoxy resin may include diglycidylether-type epoxy resins, such as bisphenol A, bisphenol F, bisphenol AD, bisphenol S, hydrogenated bisphenol A, etc., resins obtained by epoxidizing phenol- or aldehyde-based novolac resins, such as ortho-cresol-novolac-type epoxy resins, glycidylester-type epoxy resins obtained by reacting a polybasic acid such as phthalic acid, dimer acid or the like with epichlorohydrin, glycidylamine-type epoxy resins obtained by reacting an amine compound such as p-aminophenol, diaminodiphenylmethane, isocyanuric acid or the like with epichlorohydrin, linear aliphatic epoxy resins obtained by oxidizing an olefin bond with a peracid such as peracetic acid, alicyclic epoxy resins, and the like, which may be used alone or in combinations of two or more thereof. Among these, a liquid bisphenol-type epoxy resin is preferred in terms of fluidity, and a liquid glycidylamine-type epoxy resin is preferred in terms of heat resistance, adhesion, and fluidity.

The curing agent that is used to cure the epoxy resin is not particularly limited, so long as it is a liquid amine having an aromatic ring at room temperature. Examples thereof may include diethyltoluenediamine, 1-methyl-3,5-diethyl-2,4-diaminobenzene, 1-methyl-3,5-diethyl-2,6-diaminobenzene, 1,3,5-triethyl-2,6-diaminobenzene, 3,3'-diethyl-4,4'-diaminodiphenylmethane, 3,5,3',5'-tetramethyl-4,4'-diaminodiphenylmethane and the like. Examples of the liquid aromatic amine compound may include commercially available products, such as JER Cure-W and JER Cure-Z (trade names of Japan Epoxy Resin Co. Ltd.), Kayahard A-A, Kayahard AB, and Kayahard AS (trade names of Nippon Kayaku Co. Ltd.), Totoamine HM-205 (trade name of Toto Kasei Co. Ltd.), Adeka Hardener EH-101 (trade name of Asahi Denka Kogyo Co. Ltd.), Epomic Q-640 and Epomic Q-643 (trade names of Mitsui Chemicals, Inc.), DETDA80 (trade name of Lonza), etc., which may be used alone or in combinations of two or more thereof.

Additionally, a curing accelerator for accelerating curing may be further included, in addition to the curing agent, and is not particularly limited, and those conventionally known in the art may be used. The specific composition thereof may be selected by those skilled in the art.

Alternatively, a wax-based compound may be used as the encapsulation resin 21.

The wax-based compound is a resin having a molecular weight of hundreds to tens of thousands, and is solid at room temperature but has a melting point of 40° C. to 150° C. and is changed into a fluid when heated to a temperature equal to or higher than the melting point thereof. The resin includes petroleum wax, natural animal wax, natural vegetable wax, and synthetic wax, depending on the raw material. The wax-based compound in a broad sense includes semi-fluid Vaseline (petroleum jelly), liquid fluid paraffin, and liquid paraffin. Thus, some wax-based compounds may be semi-fluidized or fully fluidized at room temperature.

Examples of the petroleum wax include paraffin wax, microcrystalline wax, fluid paraffin, petroleum and the like. Examples of the natural animal wax include beeswax, wool wax and the like, and examples of the natural vegetable wax include carnauba wax and candelilla wax. The synthetic wax may be produced through an artificial petrochemical process, may be generated as a byproduct in a synthesis process, or may be directly prepared to obtain various types of polymer, copolymer or oligomer. Examples of the synthetic wax may include polyethylene-based wax (PE-based wax), polypropylene-based wax (PP-based wax), amide-based wax, F-T wax (Fischer-Tropsch wax), silicone-based wax and the like.

Preferably, the wax-based compound is polyethylene-based wax. Here, when the surface of the polyethylene-based wax does not include a separate polar group (—OH, —COOH, —COH, —O— or —CO), processing costs may be reduced and processing may be simplified because there is no need for treatment of the quantum dots 22 with a ligand. As necessary, quantum dots 22 having the above polar group may be used.

As needed, the inner-phase composition may further include a solvent for dispersing the quantum dots 22 and the encapsulation resin 21. The solvent may be a nonpolar solvent, and may be at least one selected from the group consisting of hexane, toluene, benzene, octane, chloroform, chlorobenzene, tetrahydrofuran, pentane, heptane, decane, methylene chloride, 1,4-dioxane, diethylether, cyclohexane and dichlorobenzene. This solvent enables the quantum dots 22 to be provided in the form of a suspension. The solvent may only be used during the preparation process, and is not present in the final curable emulsion composition.

(ii) Outer-Phase Composition

The term 'outer-phase composition' refers to a composition that is continuously present outside the curable emulsion composition. The outer-phase composition includes a photocurable polymerization compound and a photoinitiator.

Since the resin constituting the matrix resin 10 has to maintain optical transparency and has to be used in the state of being attached to an additional film (e.g. a barrier film 60, 70 in FIG. 15) due to the properties of the quantum-dot film 50, it has to adhere strongly to an additional film. Hence, a resin satisfying the above properties may be used.

The matrix resin 10 of the present invention may be a photocurable resin in which polymerization occurs by active energy rays, and may be a hydrophilic resin so as to be suitable for a preparation method using an emulsion, unlike the encapsulation resin 21.

The 'photocurable resin' is a component that is cross-linked due to the formation of radicals in a molecular chain using strong active energy rays such as UV, EB, radioactive rays, etc. After the photoinitiator contained in the adhesive absorbs ultraviolet having a wavelength of 200 nm to 400 nm to show reactivity, a monomer, which is the main component of the resin, is allowed to react therewith and polymerized and cured. When the photoinitiator contained in the photocurable resin is irradiated with UV light, a photopolymerization reaction is initiated, so the oligomer and monomer, that is, the main components of the resin, are polymerized and cured.

Preferably, the matrix resin 10 may be an acrylic polymer. The acrylic polymer may be prepared through polymerization of at least one selected from the group consisting of an acrylic oligomer, an acrylic monomer and combinations thereof, and the matrix resin 10 obtained after final curing may be an acrylic resin.

The acrylic oligomer may be an epoxy acrylate resin.

The epoxy acrylate resin is a resin in which the epoxide group of the epoxy resin is substituted with an acrylic group. For example, the epoxy acrylate resin may be any one selected from the group consisting of bisphenol A glycerolate diacrylate, bisphenol A ethoxylate diacrylate, bisphenol A glycerolate dimethacrylate, bisphenol A ethoxylate dimethacrylate and combinations thereof. The epoxy acrylate resin has low moisture permeability and air permeability due to the properties of the main chain thereof, like the epoxy resin.

The usable acrylic monomer is not particularly limited in the present invention, and any acrylic monomer may be used, so long as it is known in the art. Typically, the acrylic monomer may be at least one selected from the group consisting of an unsaturated-group-containing acrylic monomer, an amino-group-containing acrylic monomer, an epoxy-group-containing acrylic monomer, and a carboxylic-acid-group-containing acrylic monomer, suitable for the preparation of a homopolymer or copolymer.

Examples of the unsaturated-group-containing acrylic monomer may include methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, cyclohexyl acrylate, cyclohexyl methacrylate, phenyl acrylate, phenyl methacrylate, 2-methoxyethyl acrylate, 2-methoxyethyl methacrylate, 2-phenoxyethyl acrylate, 2-phenoxyethyl methacrylate, methoxydiethyleneglycol acrylate, methoxydiethyleneglycol methacrylate, methoxytriethyleneglycol acrylate, methoxytriethyleneglycol methacrylate, methoxypropyleneglycol acrylate, methoxypropyleneglycol methacrylate, methoxydipropyleneglycol acrylate, methoxydipropyleneglycol methacrylate, isobornyl acrylate, isobornyl methacrylate, dicyclopentadiethyl acrylate, dicyclopentadiethyl methacrylate, 2-hydroxy-3-phenoxypropyl acrylate, 2-hydroxy-3-phenoxypropyl methacrylate, glycerol monoacrylate, glycerol monomethacrylate, and the like.

Examples of the amino-group-containing acrylic monomer may include 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminopropyl acrylate, 2-dimethylaminopropyl methacrylate, 3-aminopropyl acrylate, 3-aminopropyl methacrylate, 3-dimethylaminopropyl acrylate, 3-dimethylaminopropyl methacrylate, and the like.

Examples of the epoxy-group-containing acrylic monomer may include glycidyl acrylate, glycidyl methacrylate, glycidyloxyethyl acrylate, glycidyloxyethyl methacrylate, glycidyloxypropyl acrylate, glycidyloxypropyl methacrylate, glycidyloxybutyl acrylate, glycidyloxybutyl methacrylate, and the like.

Examples of the carboxylic-acid-group-containing acrylic monomer may include acrylic acid, methacrylic acid, acryloyloxy acetic acid, methacryloyloxy acetic acid, acryloyloxy propionic acid, methacryloyloxy propionic acid, acryloyloxy butyric acid, methacryloyloxy butyric acid, and the like.

The photoinitiator may be used regardless of the type thereof, so long as it is able to form a radical due to decomposition of a molecule by absorbing light in the ultraviolet range, having a wavelength of 100 nm to 400 nm.

Specifically, the photoinitiator may include a benzoin photoinitiator, a hydroxyketone photoinitiator, an aminoketone photoinitiator or a phosphine oxide photoinitiator. Specific examples thereof may include, but are not limited to, benzoin, benzoin methylether, benzoin ethylether, benzoin isopropylether, benzoin n-butylether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenylketone, 2-methyl-1-[4-(methylthio)phenyl]-2-morpholino-propan-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone] and 2,4,6-trimethylbenzoyl-diphenyl-phosphine oxide. These photoinitiators may be used alone or in various combinations thereof.

The outer-phase composition further includes a solvent for viscosity control, dissolution of a photoinitiator, and the like. Here, the solvent may be a polar solvent, such as water, methanol, ethanol, propanol, isopropanol, butanol, acetone, dimethylformamide, etc., and is preferably water. The solvent is used only for dispersion, and is removed through a process such as depressurization, pressurization or heating, and is thus excluded from the final curable emulsion composition.

Also, the outer-phase composition may further include a crosslinking agent for a crosslinking reaction. Specific examples of the crosslinking agent useful in the present invention may include ethyleneglycol di(meth)acrylate, polyethyleneglycol di(meth)acrylate containing 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethylphthalic acid, propyleneglycol di(meth)acrylate, polypropylene glycol di(meth)acrylate containing 2 to 14 propylene groups, dipentaerythritol penta (meth)acrylate and dipentaerythritol hexa(meth)acrylate. These crosslinking agents may be used alone or in combinations of two or more thereof. The crosslinking agent is preferably used in an amount of 0.5 to 10 wt % based on the total weight of the composition.

(iii) Additional Material

The inner-phase composition and the outer-phase composition of the curable emulsion composition according to the present invention may further include various additional materials depending on the purpose thereof.

As an additional material, ceramic nanoparticles may be used for either the inner phase composition or the outer-phase composition, and are preferably added to the inner-phase composition.

Figure 2:
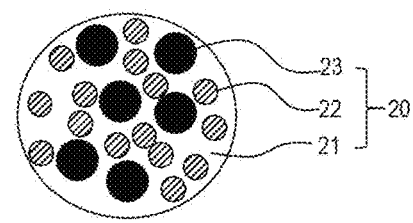
FIG. 2 is a cross-sectional view showing encapsulated quantum-dot particles according to an exemplary embodiment of the present invention.

FIG. 2 shows the encapsulated particles 20 according to an exemplary embodiment of the present invention, in which quantum dots 22 and ceramic nanoparticles 23 are dispersed in the encapsulated particles 20.

The ceramic nanoparticles 23 may be used along with the quantum dots 22 to thus minimize aggregation of the quantum dots 22. In the case in which a phenomenon of aggregation occurs between the quantum dots 22, the light emission wavelength and full width at half maximum (FWHM) change. Specifically, when two quantum dots 22 aggregate, the size of the quantum dots 22 may increase corresponding thereto. For example, the size of quantum dots 22 that converts blue light into green light is 2 nm to 2.5 nm, and when two green-light quantum dots 22 aggregate, the size of quantum dots 22 is changed to 4 nm to 5 nm, thus increasing the wavelength and FWHM of the converted green light, resulting in inaccurate fluorescence.

Figure 3:
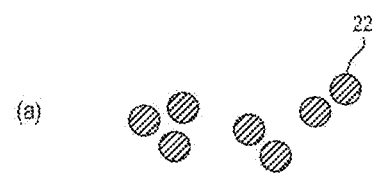
FIG. 3 schematically shows the prevention of aggregation of quantum dots using ceramic nanoparticles.
Figure 3:
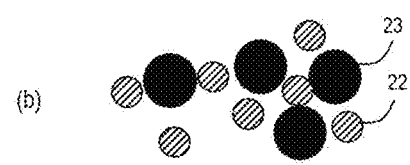

FIG. 3 schematically shows the prevention of aggregation of quantum dots 22 using ceramic nanoparticles 23. As shown in FIG. 3(a), the quantum dots 22 exist in an aggregated form, and as shown in FIG. 3(b) using the ceramic nanoparticles 23, the quantum dots 22 may be spaced apart from each other with the ceramic nanoparticles 23 interposed therebetween.

Also, the ceramic nanoparticles 23 are capable of dissipating heat generated during the operation of a display or upon emission of light from the quantum dots 22 to the outside (or toward the matrix resin 10), thus preventing deterioration of the quantum dots 22 to thereby increase the reliability of the quantum-dot film 50 and the long-term stability thereof.

Figure 4:
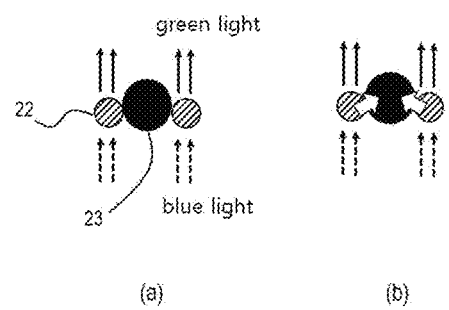
FIG. 4 schematically shows heat absorption by ceramic nanoparticles.

FIG. 4 schematically shows the absorption of heat by the ceramic nanoparticles 23. With reference to FIG. 4(a), in an exemplary embodiment, green quantum dots 22 are used; when blue light is incident on green quantum dots 22, it is converted into green light to thus emit light. In this procedure, some of the energy of the blue light is converted into heat, so the temperature of the quantum dots rises. As for the quantum dots 22, the change in luminous efficiency depending on the temperature is large. Specifically, when the quantum dots 22 emit light, the luminous efficiency decreases with an increase in the ambient temperature, and conversely, the luminous efficiency increases with a decrease in the temperature. Therefore, it is favorable to lower the temperature in order to increase the luminous efficiency.

As shown in FIG. 4(b), when the ceramic nanoparticles 23 are used together, the heat generated from the quantum dots 22 is transferred to the ceramic nanoparticles 23 (arrow). Ultimately, the ceramic nanoparticles 23 are capable of absorbing heat generated from the quantum dots 22, thus lowering the temperature of the quantum dots 22, thereby improving stability.

The function of the ceramic nanoparticles 23 as described above differs from that of conventional ceramic particles, which is to increase light conversion efficiency through light scattering.

To realize this effect, the ceramic nanoparticles 23 may be included in at least one of encapsulated particles 20 including the quantum dots 22 and the matrix resin 10, but preferably exhibit the above effects when encapsulated together with the quantum dots 22.

Usable ceramic nanoparticles 23 may be at least one selected from the group consisting of oxides, such as silica, alumina, titania, zirconia, tungsten oxide and zinc oxide, and nitrides such as $Si_3N_4$.

The ceramic nanoparticles 23 preferably have an average particle diameter of 5 nm to 450 nm. If the size thereof is less than the above lower limit, particles may aggregate and thus uniform dispersion thereof becomes difficult. On the other hand, if the size thereof exceeds the about upper limit, the relative amount of the quantum dots 22 may decrease, thus lowering the light conversion efficiency of the quantum-dot film 50.

The amount of the ceramic nanoparticles 23 is 100 to 500 parts by weight, and preferably 150 to 400 parts by weight, based on 100 parts by weight of the quantum dots 22. If the amount thereof exceeds the above upper limit, light absorption may increase and thus light conversion efficiency may decrease, or the resulting film may become non-uniform and the transparency thereof may decrease.

As another additional material, a surfactant may be used.

The surfactant is bound to the surface of droplets to prevent coalescence of the droplets and maintain the shape of the droplets. More specifically, one side of the surfactant is located at the surface side of the droplet, which is nonpolar, and the other side thereof is disposed at the polar solvent side, so the droplet is surrounded by the surfactant such that the shape of the droplet may be maintained. Meanwhile, the droplet size may be adjusted depending on the concentration of the surfactant, and, for example, the higher the concentration of the surfactant, the smaller the droplet size. The surfactant is preferably a silicone-based surfactant, a fluorine-based surfactant, an ester-based surfactant, a cationic surfactant, an anionic surfactant, a nonionic surfactant, an amphoteric surfactant, etc., and specific examples thereof may include polyoxyethylene alkyl ethers, polyoxyethylene alkylphenylethers, polyethylene glycol diesters, sorbitan fatty acid esters, fatty acid modified polyesters, tertiary amine modified polyurethanes, polyethyleneimines, etc.

Examples of the silicone-based surfactant may include commercially available products, such as DC3PA, DC7PA, SH11PA, SH21PA, SH8400, etc. manufactured by Dow Corning Toray Silicone, TSF-4440, TSF-4300, TSF-4445, TSF-4446, TSF-4460, TSF-4452, etc. manufactured by GE Toshiba Silicone.

Examples of the fluorine-based surfactant may include commercially available products, such as Megapack F-470, F-471, F-475, F-482, F-489, etc. manufactured by Dai Nippon Ink Chemical Industry Co. Ltd. Other commercially available products may include KP (manufactured by Shin-Etsu Chemical), POLYFLOW (manufactured by Kyoeisha Chemical), EFTOP (manufactured by Tochem Products), MEGAFAC (manufactured by Dai Nippon Ink Chemical Industry), Flourad (manufactured by Sumitomo 3M), Asahi guard and Surflon (manufactured by Asahi Glass), SOLSPERSE (Lubrisol), EFKA (manufactured by EFKA Chemicals), PB 821 (manufactured by Ajinomoto), Disperbyk series (manufactured by BYK-Chemie), and the like.

Specific examples of the cationic surfactant may include amine salts, such as stearylamine hydrochloride and lauryl trimethylammonium chloride, or quaternary ammonium salts.

Specific examples of the anionic surfactant may include higher alcohol sulfate ester salts such as sodium lauryl alcohol sulfate ester or sodium oleyl alcohol sulfate ester, alkyl sulfates such as sodium lauryl sulfate or ammonium lauryl sulfate, and alkylarylsulfonates such as sodium dodecyl benzenesulfonate or sodium dodecyl naphthalenesulfonate.

Specific examples of the nonionic surfactant may include polyoxyethylene alkyl ether, polyoxyethylene aryl ether, polyoxyethylene alkylaryl ether, other polyoxyethylene derivatives, oxyethylene/oxypropylene block copolymer, sorbitan fatty acid ester, polyoxyethylene sorbitan fatty acid ester, polyoxyethylene sorbitol fatty acid ester, glycerin fatty acid ester, polyoxyethylene fatty acid ester, polyoxyethylene alkylamine, and the like.

These surfactants may be used alone or in combinations of two or more thereof.

As a further additional material, a light-scattering agent may be used. Here, the light-scattering agent may be added to any of the inner-phase composition and the outer-phase composition. In particular, when the light-scattering agent is substantially located only in the inner-phase composition, the scattering effect may be maximized and thus wavelength conversion efficiency may be improved.

In addition thereto, an ultraviolet absorber, a light stabilizer, an antioxidant, an anti-yellowing agent, a bluing agent, a dispersant, a flame retardant, a dye, a filler, an organic or inorganic pigment, a release agent, a fluidity modifier, a leveling agent, an antifoaming agent, a thickener, an anti-settling agent, an antistatic agent, an anti-fogging agent and the like may be appropriately mixed within a range that does not impede the effects of the present invention.

Meanwhile, according to another embodiment of the present invention, the encapsulated quantum dots 22 may be double-encapsulated using a resin that is the same as or different from the encapsulation resin 21.

Figure 5:
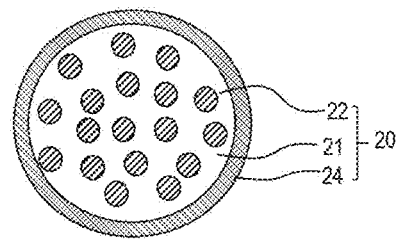
FIG. 5 is a cross-sectional view showing a quantum-dot film including double-encapsulated quantum dots.

FIG. 5 is a cross-sectional view showing the quantum-dot film 50 including double-encapsulated quantum dots 22. With reference to FIG. 5, double-encapsulated quantum dots 22 are uniformly dispersed in the matrix resin 10.

When the encapsulation process using the encapsulation resin 21 is performed once more, as in the case of the double-encapsulated quantum dots 22, the oxidation of quantum dots 22 or the lifting of both ends of the film may be prevented by more effectively blocking moisture or oxygen from the outside, thus increasing the light conversion efficiency of the quantum dots 22 and prolonging the lifetime of the quantum-dot film 50.

The primary encapsulation and secondary encapsulation of the quantum dots 22 upon double encapsulation may be performed using the thermally curable resin or the wax-based compound as described above, and the same or a similar resin may be used therefor.

The primary encapsulation and the secondary encapsulation may be carried out using an emulsion composition. Here, the primary encapsulation is performed using an emulsion in which the encapsulation resin 21 and the quantum dots 22 are dispersed in the polar solvent and the secondary encapsulation may be performed using an emulsion including the primarily encapsulated quantum dots 22 according to the present invention.

The primary encapsulation and the secondary encapsulation enable the formation of a coating layer, the thickness of which is 0.1 μm to 10 μm, and preferably 0.5 μm to 5 μm, and the amount of which may be 0.1 to 15 parts by weight and preferably 1 to 5 parts by weight, based on 100 parts by weight of the primary encapsulation resin 21. If the thickness or amount is less than the corresponding lower limit above, the probability that quantum dots are not encapsulated may increase, resulting in poor reliability. On the other hand, if the thickness or amount exceeds the corresponding upper limit above, light emission uniformity may be lowered when a wavelength conversion sheet manufactured using the encapsulated quantum dots is disposed in a display. Hence, the thickness and amount thereof are appropriately set within the above ranges.

The double encapsulation process may be performed using an emulsion composition.

Specifically, a polar solvent is placed in a mixer. Separately, the encapsulation resin 21 and the quantum dots 22 are placed in another mixer to afford a suspension. The suspension is introduced with the polar solvent, and thus phase separation may occur due to polar/nonpolar properties, whereby the nonpolar solvent, the encapsulation resin 21 and the quantum dots 22 are present as a dispersed phase in the continuous-phase polar solvent. Subsequently, the quantum dots 22 are encapsulated through various methods depending on the type of encapsulation resin 21. The encapsulated particles 20 thus obtained are recovered after removal of the solvent, and then further subjected to an encapsulation process using the matrix resin 10 and the encapsulation resin 21.

Figure 6:
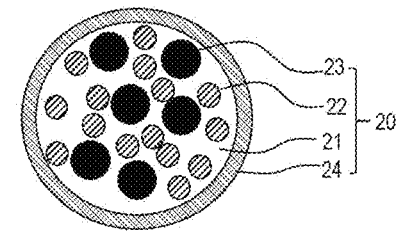
FIG. 6 is a cross-sectional view showing encapsulated quantum-dot particles including ceramic nanoparticles.

Here, double encapsulation may be performed using ceramic nanoparticles 34. FIG. 6 schematically shows the encapsulated particles including quantum dots 22 and ceramic nanoparticles 24. When the ceramic nanoparticles 24 are included in this way, the effects of the use of the ceramic nanoparticles 24 described above may be ensured.

As such, in the preparation method, the quantum dots 22 are used along with the allowable amount of the ceramic nanoparticles 24, and the specific method is dependent on the double encapsulation method described above.

According to an embodiment of the present invention, the inner-phase composition includes the quantum dots 22 in an amount of 0.1 to 5 wt %, and preferably 0.5 to 3 wt %, and includes the encapsulation resin 21 in an amount of 0.5 to 25 wt %, and preferably 2.5 to 15 wt %, in order to satisfy a total of 100 wt % of the curable emulsion composition, and additionally, each of the crosslinking agent, crosslinking accelerator, catalyst and other additives is used in an amount of 0.001 to 10 wt %.

According to an embodiment of the present invention, the outer-phase composition includes the photocurable polymerization compound in an amount of 65 to 90 wt %, and preferably 75 to 87 wt %, and includes the photoinitiator in an amount of 0.1 to 2 wt %, and preferably 0.5 to 1.5 wt %, in order to satisfy a total of 100 wt % of the curable emulsion composition.

Method of Manufacturing Quantum-Dot Film

The manufacture of the quantum-dot film 50 using the curable emulsion composition according to the present invention is performed through encapsulation of the inner phase and curing of the outer phase in the curable emulsion composition, and individual processes are independently conducted.

Here, encapsulation of the inner phase and curing of the outer phase may vary depending on the type of encapsulation resin 21, and as the encapsulation resin 21, a thermally curable resin and a wax-based compound are separately described below.

I. Thermally Curable Resin

Figure 7:
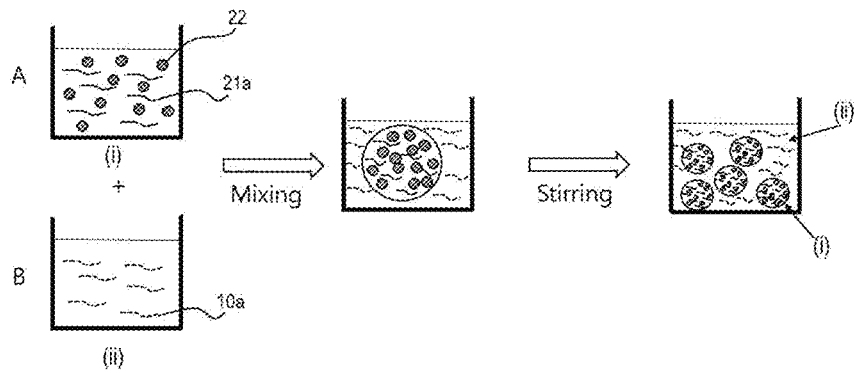
FIG. 7 schematically shows the preparation of a curable emulsion composition using a thermally curable resin as an encapsulation resin.

FIG. 7 schematically shows the preparation of a curable emulsion composition using the thermally curable resin as the encapsulation resin 21.

Specifically, a thermally curable resin 21a (before encapsulation) and quantum dots 22 are placed in a mixer A to afford an inner-phase composition (i).

The quantum dots 22 are typically provided in the form of being dispersed in an organic solvent, and the solvent may be removed before or after mixing with the encapsulation resin 21a so that no solvent is present in the inner-phase composition (i). The removal of the solvent may be performed through a typical heating or depressurization process.

The thermally curable resin is a liquid resin, and may be used in one- or two-component types, and may be utilized without additional pretreatment. The specific composition thereof is as described above.

As the mixer A, any device may be used, so long as it is equipped with a stirrer.

The inner-phase composition (i) is prepared at room temperature, and stirring is performed for uniform mixing thereof. Here, the stirring conditions may vary depending on the size of the mixer and the amounts of components in the composition, but stirring may be conducted at about 100 to 5000 rpm. The mixing time is set so that the components are uniformly mixed, and is typically 1 min to 30 min.

Next, a photocurable polymerization compound and a photoinitiator 10a (before photocuring) are mixed in a separate mixer B to afford an outer-phase composition (ii).

Here, the mixer B may be a typical emulsification device for the preparation of an emulsion. The emulsification device may be a homogenizer or a sonicator, and is preferably a homogenizer, but the type of emulsification device is not limited in the present invention.

The outer-phase composition (ii) is prepared at room temperature, and stirring is performed for uniform mixing thereof. Here, the stirring conditions may vary depending on the size of the mixer and the amounts of components in the composition, but stirring may be conducted at about 100 to 5000 rpm. The mixing time is set so that the components are uniformly mixed, and is typically 1 min to 30 min.

Next, the outer-phase composition (ii) is added with the inner-phase composition (i) prepared above with stirring, thus preparing a curable emulsion composition.

The curable emulsion composition is prepared at room temperature, and stirring is performed for uniform mixing thereof. Here, the stirring conditions may vary depending on the size of the mixer and the amounts of components in the composition, but stirring may be conducted at about 100 to 5000 rpm. The mixing time is set so that the components are uniformly mixed, and is typically 5 min to 2 hr.

When the inner-phase composition (i) is added to the outer-phase composition (ii), phase separation occurs due to a hydrophobic/hydrophilic difference between the inner-phase composition (i) and the outer-phase composition (ii), and the inner-phase composition (i) is present in the form of droplets in the outer-phase composition (ii).

The curable emulsion composition thus prepared is configured such that the inner-phase composition (i) is present in the form of droplets having a size of 0.1 μm to 100 μm and preferably 1 μm to 10 μm and the outer-phase composition (ii) is present in a continuous phase.

Here, the droplet size may be controlled by adjusting the amount ratio of the inner-phase composition (i) and the outer-phase composition (ii). Preferably, the inner-phase composition (i) and the outer-phase composition (ii) are mixed at a weight ratio of about 0.1:99.9 to 20:80, and preferably about 10:90 to 5:95. When the mixing ratio falls out of the above range, the droplets may not be formed or the distance between quantum dots 22 may decrease, and thus dispersion may be impeded and light conversion efficiency may decrease.

Also, the droplet size may be controlled using a surfactant. As a usable surfactant, the surfactant described above may be used, and the surfactant may be used in a manner of being added either to the process of preparing the inner-phase composition (i) or to the process of preparing the outer-phase composition (ii).

The method of manufacturing the quantum-dot film 50 using the curable emulsion composition prepared above may be performed in a manner in which curing of any one of the inner-phase composition (i) and the outer-phase composition (ii) is first conducted and then curing of the remaining one thereof is conducted. Here, the inner-phase composition (i) may be subjected to curing (i.e. encapsulation) in a manner of applying heat due to the use of the thermally curable resin, and the outer-phase composition (ii) may be subjected to curing through light irradiation due to photocuring properties thereof. The method in which curing of the inner-phase composition (i) is first performed (first method) and the method in which curing of the outer-phase composition (ii) is first performed (second method) are described below.

(i) First Method

The first method is a method that is performed using the thermally curable resin as the encapsulation resin 21, and heat curing for encapsulation and then photocuring are sequentially performed. In the present invention, the quantum dots are encapsulated using an encapsulation resin, thereby increasing resistance to moisture or oxygen in the air to thus prevent the lifetime and performance from decreasing due to oxidation of the quantum dots.

Figure 8:
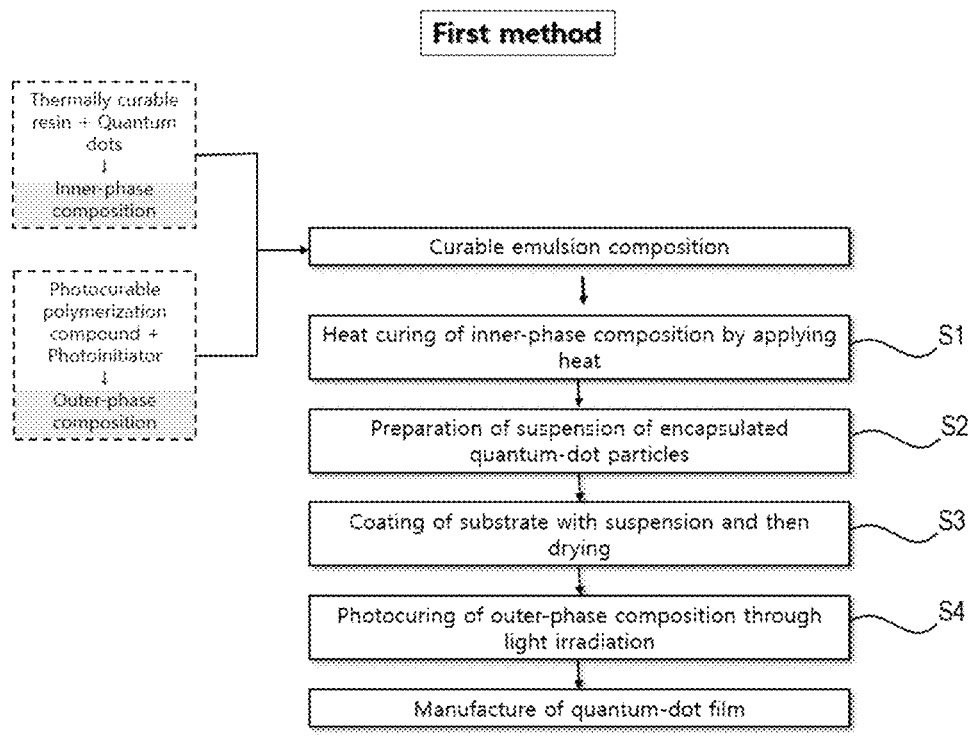
FIG. 8 is a flowchart showing a process of manufacturing a quantum-dot film according to a first embodiment of the present invention.
Figure 9:
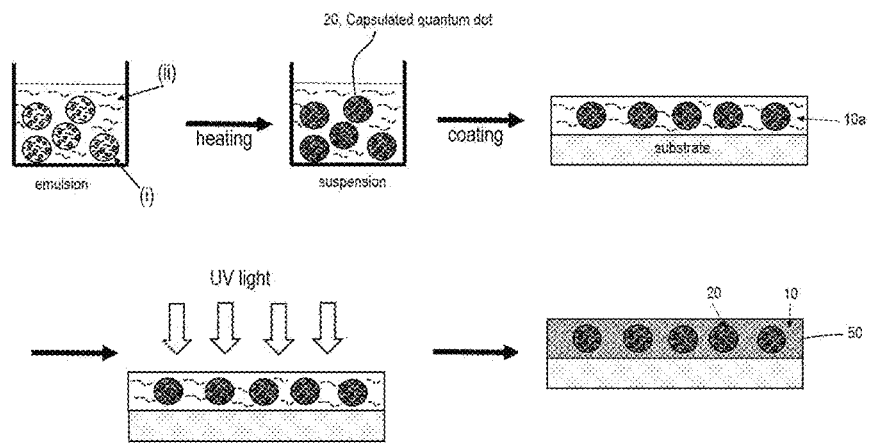
FIG. 9 is a schematic view thereof.

FIG. 8 is a flowchart showing the process of manufacturing the quantum-dot film 50 according to a first embodiment of the present invention, and FIG. 9 is a schematic view thereof. In FIG. 9, the process after curing is represented by the dark color.

With reference to FIGS. 8 and 9, the quantum-dot film 50 is manufactured by:

(S1) manufacturing encapsulated particles 20 by heat-curing an encapsulation resin 21 in an inner-phase composition (i) by applying heat to a curable emulsion composition;

(S2) preparing a suspension in which the encapsulated particles 20 are dispersed in an outer-phase composition (ii);

(S3) coating a substrate with the suspension and then performing drying; and (S4) obtaining a matrix resin 10 by photocuring the outer-phase composition (ii) by irradiating the coating film thus obtained with light.

Individual steps are specified below.

First, the thermally curable resin of the inner-phase composition (i) is cured by applying heat to the curable emulsion composition (S1).

Here, heat curing is performed in a mixer equipped with a stirrer. The mixer is equipped with a temperature controller such as a heater, which may increase the temperature for heat curing.

The temperature and time for heat curing may vary depending on the type of thermally curable resin. For example, when using silicone oil, heat curing is performed at 100° C. to 125° C. for 1 hr to 5 hr, and when using epoxy resin, heat curing is performed at 80° C. to 120° C. for 30 min to 4 hr. The curing temperature may vary depending on the composition.

After completion of the heat curing, encapsulated particles 20 obtained by encapsulating the quantum dots 22 with the thermally curable resin may be obtained, and the encapsulated particles 20 are uniformly dispersed in the outer-phase composition (ii) to afford a suspension (S2).

In the emulsion state, heat curing of the thermally curable resin occurs only within the droplets, and consequently, one encapsulated particle 20 may be obtained from one droplet to afford encapsulated particles 20 on the micrometer scale. These encapsulated particles 20 are manufactured through continuous mixing, and individual particles 20 are independently present without aggregation.

The suspension is subjected to a subsequent process without additional treatment.

Next, the substrate is coated with the suspension and then dried, thus forming a coating film (S3).

The substrate may be a glass substrate or a plastic substrate. Preferably, a plastic substrate, and more preferably a barrier film 60 or 70 (FIG. 15), is used, as will be described later. Alternatively, the substrate may be a plate-type substrate, a tube-type substrate, or a substrate having a light-emitting diode mounted thereon, but the present invention is not limited thereto.

The coating process is not particularly limited in the present invention, and a known wet coating process may be performed. Examples of the coating process for forming a thin uniform coating film may include, but are not necessarily limited to, dip coating, flow coating, spray coating, roll coating, spin coating, and gravure coating. The thickness of the coating film in the coating process may be determined in consideration of a reduction in the thickness of the coating film after drying and after photocuring, and is set to 1.5 to 5 times the final thickness. Accordingly, the coating process may be performed one or more times.

The drying process may be performed using any process typically known in the art. The drying process may be conducted through hot-air heating or induction heating, but is not limited thereto. When a hot-air heating process is performed, the above composition may be dried through hot-air treatment at 40° C. to 80° C. for 10 sec to 50 sec. An induction heating process may be performed in the frequency range of 1 MHz to 50 MHz at a power of 1 to 15 KW for 5 sec to 20 sec. When drying is performed in this way, the water or solvent may be completely removed from the outer-phase composition (ii). The water or solvent may deteriorate the properties of the quantum-dot film 50.

The dried coating film has a structure configured such that the encapsulated quantum-dot particles 20 are uniformly dispersed in the matrix resin 10a in the outer-phase composition (ii).

Subsequently, the coating film is irradiated with light, whereby the outer-phase composition (ii) is photocured to afford a matrix resin 10, ultimately obtaining a quantum-dot film 50 (S4).

Photocuring is performed in a manner in which active energy is emitted from a light source and is radiated onto the coating film.

Examples of the light source may include light such as far-ultraviolet, ultraviolet, near-ultraviolet, infrared, and the like, electromagnetic waves such as X-rays, γ-rays, and the like, electron beams, proton rays, neutron beams, etc. Using ultraviolet irradiation for curing is advantageous in view of the curing speed, the availability of irradiation devices, and the price.

As a light source used for ultraviolet irradiation, a high-pressure mercury lamp, an electrodeless lamp, an ultra-high-pressure mercury lamp, a carbon arc lamp, a xenon lamp, an LED lamp, a metal halide lamp, a chemical lamp, a black light, etc. may be used. For example, a high-pressure mercury lamp is used under conditions of 5 mJ/cm$^2$ to 3000 mJ/cm$^2$, and particularly 400 mJ/cm$^2$ to 1500 mJ/cm$^2$.

Moreover, the irradiation time varies depending on the type of light source, the distance between the light source and the coating film, the thickness of the coating film, and other conditions, but the irradiation time typically falls in the range from ones of seconds to tens of seconds, and in some cases may be one second.

(ii) Second Method

The second method is a method that is performed using the thermally curable resin as the encapsulation resin 21, and photocuring and then heat curing are sequentially performed. The present invention is advantageous because an encapsulation resin that exhibits properties similar to those of the resin used in the first method is used, thereby improving resistance to moisture or oxygen in the air, ultimately preventing the lifetime and performance from decreasing due to the oxidation of quantum dots.

Figure 10:
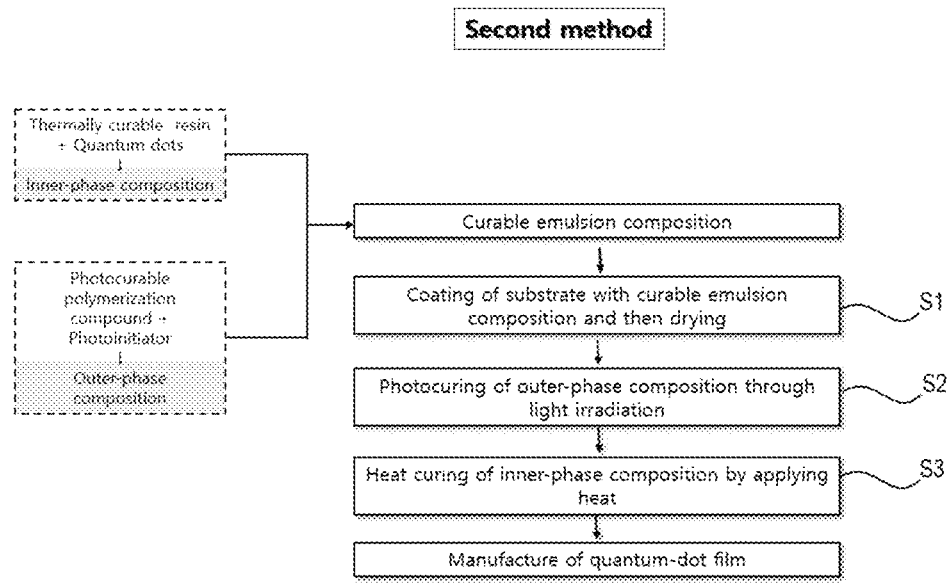
FIG. 10 is a flowchart showing a process of manufacturing a quantum-dot film according to a second embodiment of the present invention.
Figure 11:
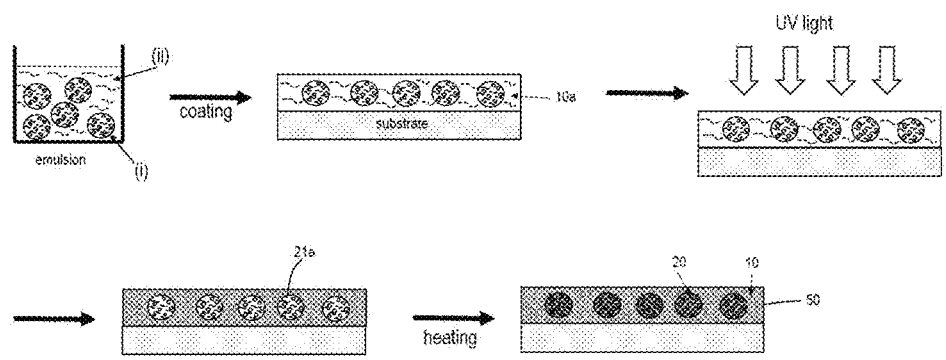
FIG. 11 is a schematic view thereof.

FIG. 10 is a flowchart showing the process of manufacturing the quantum-dot film 50 according to a second embodiment of the present invention, and FIG. 11 is a schematic view thereof.

With reference to FIGS. 10 and 11, the quantum-dot film 50 is manufactured by:

(S1) coating a substrate with a curable emulsion composition and then performing drying;

(S2) obtaining a matrix resin 10 by photocuring the outer-phase composition (ii) by irradiating the coating film obtained above with light; and (S3) manufacturing encapsulated quantum-dot particles 20 by heat-curing an encapsulation resin 21a in an inner-phase composition (i) by applying heat to the coating film thus obtained.

First, the substrate is coated with the curable emulsion composition and then dried (S1).

Here, the coating and drying processes may be performed as in the first method.

However, in consideration of the curing temperature of the thermally curable resin composition, that is, to prevent the inner-phase composition (i) from being cured while drying the same, the drying process is performed at a temperature lower than the above curing temperature. As necessary, drying may be performed using a vacuum oven through pressurization or depressurization.

Next, the coating film is irradiated with light, thus photocuring the outer-phase composition (ii) (S2).

The conditions for photocuring are as described in the first method. Here, in order to prevent curing of the inner-phase composition (i), photocuring is preferably conducted at room temperature. After photocuring, the inner-phase composition (i) in the matrix resin 10 is present in the form of droplets.

Next, heat is applied to the coating film thus obtained, thereby heat-curing the inner-phase composition (i), ultimately obtaining a quantum-dot film 50.

Specific methods of (S1) to (S3) that are not mentioned are as described in the first method.

II. Wax-Based Compound

As the encapsulation resin 21, a wax-based compound is typically present in a solid phase at room temperature, and in order to apply the same to an emulsion, heat at a temperature equal to or higher than the melting point of the wax-based compound is applied, whereby the wax-based compound may be converted into a liquid and thus used.

Figure 12:
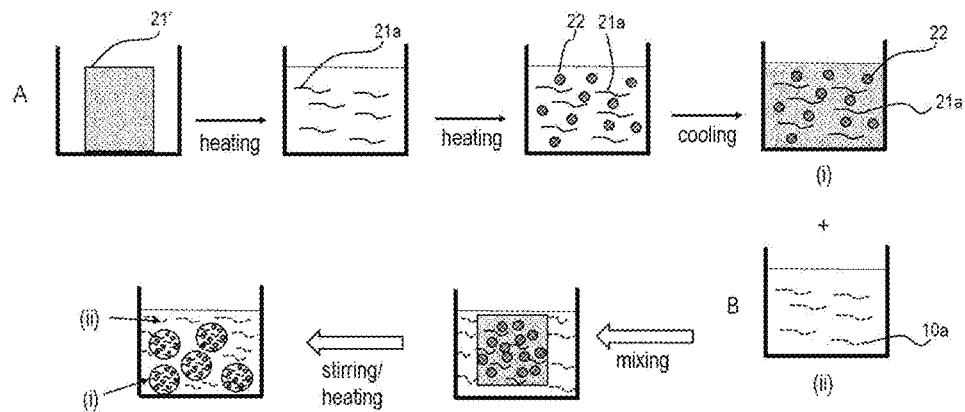
FIG. 12 schematically shows the preparation of a curable emulsion composition using a wax-based compound as an encapsulation resin.

FIG. 12 schematically shows the preparation of a curable emulsion composition using the wax-based compound as the encapsulation resin 21.

First, a solid wax-based compound 21' is placed in a mixer A, after which the wax-based compound is heated to a temperature equal to or higher than the melting point thereof and thus converted into a liquid encapsulation resin 21a.

The mixer A is equipped with a stirrer and a temperature controller.

The melting point of the wax-based compound may vary depending on the type of wax-based compound. For example, a low-density-polyethylene-wax-based compound has a melting point of 80° C. to 140° C., and is liquefied by applying heat at the above temperature.

Next, the liquid encapsulation resin 21a is added with a predetermined amount of quantum dots 22 and uniformly mixed, thus preparing an inner-phase composition (i). Here, the mixing process is carried out in a warmed state so that the encapsulation resin 21a remains liquid.

In this mixing process, stirring conditions may vary depending on the size of the mixer and the amounts of the components of the composition, but stirring may be performed at about 100 rpm to 5000 rpm. The mixing time is typically set to the range of 1 min to 30 min in order to realize uniform mixing.

Next, the temperature of the mixer is lowered so that the liquid inner-phase composition (i) is solidified. The solidification may be achieved by lowering the temperature of the mixer to a temperature equal to or lower than the melting point of the wax-based compound, preferably to room temperature. Here, the quantum dots 22 are uniformly dispersed in the solid encapsulation resin 21a.

The inner-phase composition (i) in a liquid phase may be mixed with the outer-phase composition (ii) to afford a curable emulsion composition, but for convenience in processing, the inner-phase composition may be converted into a solid, which is then applied to the preparation of a curable emulsion composition.

Next, a photocurable polymerization compound and a photoinitiator are placed in a separate mixer B to afford an outer-phase composition (ii).

Here, the mixer B may be a typical emulsification device for the preparation of an emulsion. The emulsification device may be a homogenizer or a sonicator, and is preferably a homogenizer, but the type of emulsification device is not limited in the present invention.

Next, the inner-phase composition (i) is added to the outer-phase composition (ii), after which the mixer B is warmed, so the wax-based compound in the inner-phase composition (i) is melted.

The warming process is performed at a temperature equal to or higher than the melting point of the wax-based compound, whereby the wax-based compound is converted into a liquid, so the liquid inner-phase composition (i) and the outer-phase composition (ii) are phase-separated due to a hydrophobic/hydrophilic difference, thus preparing a curable emulsion composition in which the inner-phase composition (i) is present in the form of droplets.

The manufacture of the quantum-dot film 50 using the curable emulsion composition thus prepared may be performed in a manner in which the inner-phase composition (i) is first solidified and then the outer-phase composition (ii) is photocured.

(iii) Third Method

The third method is a method that is performed using a wax-based compound as the encapsulation resin 21, and encapsulation through liquid-solid temperature control of a wax-based compound and then photocuring are sequentially conducted. The present invention is advantageous because an encapsulation resin that exhibits properties similar to those of the first and second methods is used, thus increasing resistance to moisture or oxygen in the air, thereby preventing the lifetime and performance from decreasing due to the oxidation of quantum dots.

Figure 13:
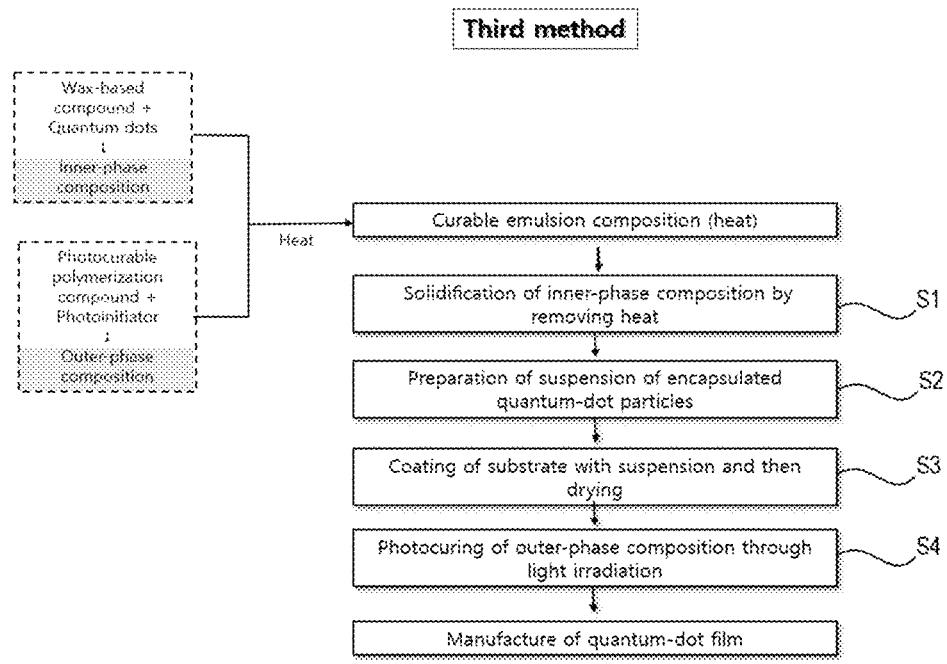
FIG. 13 is a flowchart showing a process of manufacturing a quantum-dot film according to a third embodiment of the present invention.
Figure 14:
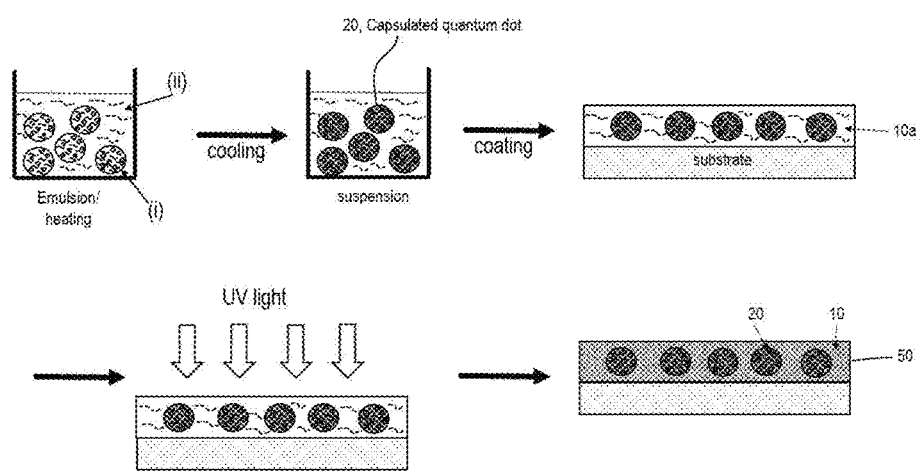
FIG. 14 is a schematic view thereof.

FIG. 13 is a flowchart showing the process of manufacturing the quantum-dot film 50 according to a third embodiment of the present invention, and FIG. 14 is a schematic view thereof.

With reference to FIGS. 13 and 14, the quantum-dot film 50 is manufactured by:

(S1) manufacturing encapsulated particles 20 in which quantum dots 22 are encapsulated with an encapsulation resin 21 by cooling a curable emulsion composition;

(S2) preparing a suspension in which the encapsulated particles 20 are dispersed in an outer-phase composition (ii);

(S3) coating a substrate with the suspension and then performing drying; and (S4) obtaining a matrix resin 10 by photocuring the outer-phase composition (ii) by irradiating the coating film thus obtained with light.

Individual steps are specified below.

The curable emulsion composition is maintained in the state of being warmed to a temperature equal to or higher than the melting point of the wax-based compound so that the wax-based compound remains liquid. Subsequently, when the temperature is lowered to room temperature, solidification occurs, thereby manufacturing encapsulated particles 20 in which the quantum dots 22 are encapsulated with the wax-based compound (S1).

Here, the cooling rate is adjusted by slowly or rapidly decreasing the temperature of the mixer to room temperature. When the cooling rate is high, that is, when the temperature of the liquid wax-based compound is rapidly lowered, the size of the encapsulated particles 20 formed using the wax-based compound may be decreased. On the other hand, when the above temperature is slowly lowered, the size of the encapsulated particles 20 may be increased. Typically, the cooling process is performed at a rate of 0.1° C. to 2° C. per minute, thereby stably manufacturing encapsulated particles 20 on the micrometer scale.

After completion of the cooling, the curable emulsion composition is obtained in the form of a suspension in which the encapsulated particles 20 are dispersed in the outer-phase composition (ii) (S2).

The suspension is applied to a subsequent step without additional post-treatment.

Next, the suspension is applied on the substrate and then dried, thus forming a coating film (S3).

The substrate, the type of coating process, drying, and formation of the coating film in the present step are as described in the first method.

Next, the coating film is irradiated with light, thus photocuring the outer-phase composition (ii) to afford a matrix resin 10, ultimately obtaining a quantum-dot film 50 (S4).

The specific processing for photocuring in the present step is as described in the first method.

The quantum-dot film 50 thus manufactured is configured such that the encapsulated particles 20, in which the quantum dots 22 are encapsulated with the encapsulation resin 21, such as the thermally curable resin or the wax-based compound, are uniformly dispersed in the matrix resin 10, as shown in FIG. 1.

In the present invention, the curable emulsion composition is prepared using the emulsion, thus solving problems with conventional preparation processes in which quantum dots 22 aggregate, thereby making it possible to stably manufacture a quantum-dot film 50 in which the quantum dots 22 are uniformly dispersed at a high concentration in the matrix resin 10.

In particular, the droplets, which are the inner phase in the curable emulsion composition, are solidified as they are, so the size of the encapsulated particles 20 may become constant and a very narrow particle size distribution may result. This method contrasts with conventional cases in which encapsulated particles are manufactured separately. Specifically, when the encapsulated particles are manufactured separately, the quantum dots 22 may aggregate, and thus the size of the encapsulated particles may fall in the range from ones to thousands of micrometers and thus a wide particle size distribution may result. Typically, the particle size distribution is directly associated with the dispersion of the quantum dots in the quantum-dot film, and also with the overall light conversion efficiency of quantum dots. When the quantum dots are uniformly distributed in the matrix resin, the light conversion efficiency of quantum dots throughout the film may become uniform.

Also, the encapsulation of the quantum dots 22 and the preparation of the matrix resin 10 (photocuring) may be performed without separate treatment of the curable emulsion composition, and thus the manufacturing process may become very simple, and it is easy to apply a roll-to-roll process for mass production of the quantum-dot film 50.

There is disclosed a conventional method of preparing a matrix resin through encapsulation of quantum dots using a wax-based compound and photocuring. This method is performed in a manner in which the quantum dots are encapsulated in a solvent, rather than in an emulsion, and are then dried to obtain encapsulated particles, which are then added to a photocurable composition. Thereby, the preparation process essentially requires the use of a solvent that is otherwise unnecessary for the process, followed by drying and recovering particles, undesirably increasing processing costs and complicating the preparation process.

Moreover, in the present invention, encapsulation of the quantum dots 22 and preparation of the matrix resin through photocuring are independently performed, thus increasing the encapsulation quality of the encapsulated particles 20 and the quality of the matrix resin 10. Conventionally, a technique for manufacturing a quantum-dot film by performing ultraviolet curing once using an emulsion composition is proposed, but is problematic because coalescence between droplets occurs, making it impossible to stably encapsulate the quantum dots. Therefore, in the present invention, the quantum dots 22 may be stably encapsulated by independently performing encapsulation and photocuring.

In particular, the above conventional method is limited with regard to the maximum amount of encapsulated particles in the matrix resin in consideration of dispersion stability of the composition. However, when the method using the emulsion is performed, as in the present invention, the overall droplet size is uniform and high dispersion stability may result, so the amount of the encapsulated particles 20, that is, the amount of the quantum dots 22 present in the matrix resin 10, may be effectively increased.

The quantum-dot film 50 manufactured according to the present invention includes, based on 100 parts by weight of the matrix resin 10, 0.5 to 20 parts by weight, preferably 1 to 10 parts by weight, of the encapsulated particles including the quantum dots 22. Also, in the encapsulated particles 20, the amount of the quantum dots 22 is 0.1 to 10 parts by weight, and the amount of the encapsulation resin 21 is 0.1 to 20 parts by weight, and preferably 0.5 to 10 parts by weight.

The composition ratio of the matrix resin 10, quantum dots 22 and encapsulation resin 21 is set in consideration of uniform dispersion and light conversion efficiency of the quantum dots 22 and the properties of the quantum-dot film 50, such as optical transmittance, strength, etc. If the amount of the quantum dots 22 is less than the above lower limit, the light conversion effect may become insignificant, and thus low light conversion efficiency may result. On the other hand, if the amount thereof is too excessive, uniform dispersion may become difficult. Also, if the amount of the encapsulation resin 21 is less than the above lower limit, it is difficult to sufficiently encapsulate the quantum dots 22. On the other hand, if the amount thereof exceeds the above upper limit, the transmittance of the quantum-dot film 50 may decrease.

Also, the wavelength conversion film 50 according to the present invention has a thickness of 50 an to 300 μm, preferably 70 μm to 180 μm. In particular, the use of the hydrophobic resin as the encapsulation resin 21 is effective at protecting the quantum dots 22 from moisture and air.

Moreover, the acrylic resin used as the matrix resin 10 may exhibit good adhesion to a substrate or a barrier film, which will be described later, and is thus effective at preventing permeation of moisture or oxygen from the outside, thereby preventing oxidation of the quantum dots 22. Furthermore, the encapsulated particles 20, that is, the quantum dots 22, may be dispersed in a large amount (i.e. high concentration) of 0.1 to 10 parts by weight, and preferably 0.5 to 2 parts by weight, in the matrix resin 10, thereby further increasing light conversion efficiency.

The quantum-dot film 50 is applicable to a wavelength conversion sheet for a display, and is capable of realizing a high color gamut screen.

Wavelength Conversion Sheet

The quantum-dot film 50 according to the present invention may be used as a wavelength conversion sheet.

As used herein, the wavelength conversion sheet is a film that is able to convert the wavelength of light emitted from a light source. For example, when the light source emits blue light having a wavelength of about 430 nm to about 470 nm, the blue light may be converted into green light having a wavelength of about 520 nm to about 560 nm and/or red light having a wavelength of about 600 nm to about 660 nm.

Figure 15:
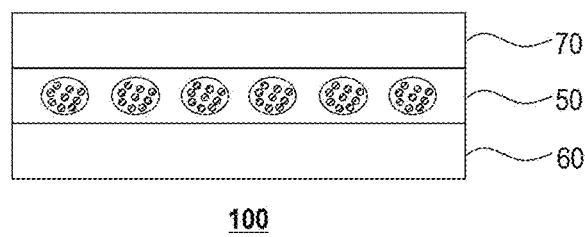
FIG. 15 is a cross-sectional view showing a wavelength conversion sheet according to an embodiment of the present invention.

FIG. 15 is a cross-sectional view showing the wavelength conversion sheet according to an embodiment of the present invention. With reference to FIG. 15, the wavelength conversion sheet 100 is configured such that a quantum-dot film 50 is interposed between a first barrier film 60 and a second barrier film 70.

The first barrier film 60 and the second barrier film 70 function to support and protect the quantum-dot film 50, and more specifically to prevent the quantum dots 22 from being oxidized due to permeation of moisture or oxygen in external air into the quantum-dot film 50.

Each of the first barrier film 60 and the second barrier film 70 may include a single material or a composite material acting as a strong barrier to moisture and/or oxygen. For example, the first barrier film and the second barrier film may include a polymer acting as a strong barrier to moisture and/or oxygen, for example, polyethylene, polypropylene, polyvinyl chloride, polyvinylalcohol, ethylene vinyl alcohol, polychlorotrifluoroethylene, polyvinylidene chloride, nylon, polyaminoether, or a cyclic olefin homopolymer or copolymer.

The first barrier film 60 and the second barrier film 70 are depicted in a monolayer form in the drawing, but are not limited thereto. The first barrier film 60 and the second barrier film 70 may be provided in a multilayer form. For example, the first barrier film 60 and the second barrier film 70 may have a stack structure including a base substrate and a protective layer formed on the base substrate.

For example, the first barrier film 60 and the second barrier film 70 may be provided in a form in which the base substrate is coated with an inorganic film or an organic-inorganic hybrid film acting as a strong barrier to moisture and/or oxygen. Here, the inorganic film or the organic-inorganic hybrid film may be composed mainly of Si or Al oxide or nitride. As such, the base substrate may be a polymer film having high light transmittance and heat resistance, for example, a polymer film including polyethylene terephthalate (PET), polyethylene naphthalate (PEN), cyclic olefin copolymer (COC), cyclic olefin polymer (COP), etc.

Preferably, the first barrier film 60 and the second barrier film 70 have moisture permeability of about $10^{-1}$ g/m$^2$/day to $10^{-3}$ g/m$^2$/day under conditions of 37.8° C. and 100% relative humidity, and air permeability of about $10^{-1}$ cc/m$^2$/day/atm to $10^{-2}$ cc/m$^2$/day/atm under conditions of 23° C. and 0% relative humidity.

Also, the first barrier film 60 and the second barrier film 70 preferably have a linear transmittance of about 88% to 95% in the visible light range of 420 nm to 680 nm.

The wavelength conversion sheet 100 of the present invention may be manufactured using the aforementioned curable emulsion composition between the first barrier film 60 and the second barrier film 70. Here, the wavelength conversion sheet 100 may be manufactured using any one of the aforementioned three methods depending on the type of encapsulation resin 21 of the inner-phase composition.

For example, when using the first method, the method of manufacturing the wavelength conversion sheet includes:

(S1) manufacturing encapsulated particles 20 by heat-curing an inner-phase composition, (S2) forming a coating film by applying a composition in which the encapsulated particles 20 are dispersed on any one film of the first barrier film and the second barrier film, (S3) disposing the remaining one of the first barrier film and the second barrier film on the coating film, and (S4) manufacturing a quantum-dot coating layer 50 by curing the coating film through light irradiation, thereby manufacturing a wavelength conversion sheet 100 including the first barrier film 60, the quantum-dot coating layer 50 and the second barrier film 70, which are stacked.

Moreover, it is possible to manufacture a wavelength conversion sheet by appropriately applying the second and the third method as described above.

The wavelength conversion sheet 100 thus manufactured has a total thickness of 70 μm to 300 μm and a haze of 5% to 45%.

Display

Since quantum dots are capable of emitting light, the wavelength conversion sheet of the present invention is applicable to a display.

A liquid-crystal-display-(LCD)-based display is capable of exhibiting high luminance and high color gamut using light emission. Accordingly, for an LCD panel, the wavelength conversion sheet may be applied to a backlight unit (BLU). In an LCD panel having a general structure, about ⅔ of the light emitted from a backlight unit (BLU) is absorbed by a color filter, so light conversion efficiency is poor.

Therefore, in a display using QDs in which the wavelength conversion sheet of the present invention is applied to an LCD panel and a backlight unit, quantum dots in the film are capable of converting blue light, which is the backlight, into green and red light, and some of the blue light is transmitted to thus generate white light having high color purity, thereby realizing high luminance and color gamut. Moreover, the viewing angle is increased due to the isotropic light emission properties of the quantum dots, and the thickness of the liquid crystal may be reduced, thereby improving the response time thereof.

The display is not particularly limited in the present invention, and is applicable to a backlight unit (BLU) for display devices such as TV sets, monitors, tablets, smartphones, personal digital assistants (PDAs), gaming devices, electronic reading devices or digital cameras.

Moreover, the wavelength conversion sheet of the present invention may be used for indoor or outdoor lighting, stage lighting, decorative lighting, accent lighting or museum lighting, and may also be used in special wavelength lighting required in horticulture or biology, but the range of applications to which the lighting device may be applied is not limited to the foregoing.

MODE FOR INVENTION

Examples

A better understanding of the present invention will be given through the following examples. However, these examples are merely set forth to illustrate the present invention, and are not to be construed as limiting the scope of the present invention.

Example 1

(1) Preparation of Curable Emulsion Composition 25 g of toluene was placed in a 10 ml glass bottle, and 25 mg of silicone oil and 0.06 ml of a quantum-dot dispersion (1.2 mg of quantum dots) were then added thereto to afford an inner-phase composition. The quantum-dot dispersion was prepared by dispersing CdSe quantum dots having octadecylamine as a capping layer (Nanodot-HE, Ecoflux, Korea) at a concentration of 20 mg/ml in toluene.

A photocurable resin in which 0.015 g of a UV curing initiator (Irgacure 184) was dispersed in 0.5 g of a urethane acrylate oligomer was prepared. The inner-phase composition was mixed with the photocurable resin, after which the solvent was completely removed using a decompression rotary evaporator, thereby preparing a coating solution.

(2) Formation of Wavelength Conversion Sheet

The curable emulsion composition prepared above was heated to 80° C. for 35 min with stirring at 3,500 rpm, whereby the silicone oil of the inner phase was cured to afford a suspension in which the encapsulated quantum-dot particles were dispersed.

The suspension was applied between a first barrier film (i-Components, 50 μm) and a second barrier film (i-Components, 50 μm) of a PET base and dried at 85° C. for 60 min, thus forming a coating film. Subsequently, the coating film was exposed to UV (1000 mJ/cm$^2$) for 2 min and cured, thus manufacturing a wavelength conversion sheet. Here, the thickness of the quantum-dot film including the encapsulated quantum-dot particles was 80 μm.

Example 2

The curable emulsion composition of Example 1 was applied between a first barrier film (i-Components, 50 μm) and a second barrier film (i-Components, 50 μm) of a PET base, and the coating film was exposed to UV at 1000 mJ/cm$^2$ for 1 min and cured, thus curing the acrylic resin of the outer phase.

Subsequently, the coating film thus obtained was heated to 85° C. for 60 min, whereby the silicone oil of the inner phase was cured to afford a wavelength conversion sheet in which quantum dots were encapsulated. Here, the thickness of the quantum-dot film including the encapsulated quantum-dot particles was 80 μm.

Example 3

A wavelength conversion sheet was manufactured in the same manner as in Example 1, with the exception that 1.2 mg of ceramic nanoparticles (average particle diameter: 300 nm) were further added.

Example 4

(1) Preparation of curable emulsion composition 25 g of toluene was placed in a 10 ml glass bottle, and 25 mg of a polyethylene-wax-based compound and 0.06 ml of a quantum-dot dispersion were then added thereto, after which toluene was removed to afford an inner-phase composition. The quantum-dot dispersion was prepared by dispersing CdSe quantum dots having octadecylamine as a capping layer (Nanodot-HE, Ecoflux, Korea) at a concentration of 20 mg/ml in toluene.

A photocurable resin solution in which a UV curing initiator (Irgacure 184) was dispersed in 0.5 g of a urethane acrylate oligomer was prepared. The inner-phase composition was mixed with the photocurable resin, after which the solvent was completely removed using a decompression rotary evaporator, thereby preparing a coating solution (2) Formation of Wavelength Conversion Sheet The curable emulsion composition prepared above was heated to 100-110° C. with stirring at 100 rpm until it became transparency, and was then cooled to room temperature, whereby the polyethylene-wax-based compound of the inner phase was cured to afford a suspension in which the encapsulated quantum-dot particles were dispersed.

The suspension was applied between a first barrier film (i-Components, 50 μm) and a second barrier film (i-Components, 50 μm) of a PET base, and the resulting coating film was exposed to UV at 1000 mJ/cm$^2$ for 1 min and cured, thus manufacturing a wavelength conversion sheet. Here, the thickness of the quantum-dot film including the encapsulated quantum-dot particles was 80 μm.

Comparative Example 1

A dispersion in which 20 mg of CdSe quantum dots (Nanodot-HE, Ecoflux, Korea) were dispersed in 1 ml of toluene was added to an acrylic monomer, IBOA (isobornyl acrylate), and mixed, and toluene was then removed using an evaporator.

Subsequently, the resulting solution was mixed with urethane acrylate, available from BASF (Germany), and a photoinitiator (diphenyl(2,4,6-trimethylbenzoyl)phosphine oxide, TPO). A coating composition was prepared by mixing 0.8 parts by weight of TPO based on 100 parts by weight of urethane acrylate.

Here, the coating composition contained 5 parts by weight of the encapsulated quantum dots based on 100 parts by weight of urethane acrylate.

The coating composition was applied to a thickness of 80 μm on a first barrier film (i-Components, Korea), thus forming a coating layer.

A second barrier film, which is substantially the same as the first barrier film, was prepared, and the coating layer was covered with the second barrier film so as to come into contact therewith, and irradiated with UV light to cure the coating layer, thereby forming a wavelength conversion sheet.

Comparative Example 2

(1) Preparation of Curable Emulsion Composition

PEGDA (poly(ethyleneglycol)diacrylate, CAS No: 26570-48-9, solubility parameter (HSP): 18 (cal/cm$^3$)$^{1/2}$), LA (lauryl acrylate, CAS No: 2156-97-0, solubility parameter (HSP): 8 (cal/cm$^3$)$^{1/2}$), bisfluorene diacrylate (BD, CAS No: 161182-73-6, solubility parameter (HSP): 8 to 9 (cal/cm$^3$)$^{1/2}$), CdSe quantum dots (Nanodot-HE, Ecoflux, Korea), a surfactant (polyvinylpyrrolidone) and a zinc salt (Zn acetate) were mixed at a weight ratio of 9:1:1:01:005:01 (PEGDA:LA:BD:green particles:surfactant:zinc salt). Subsequently, radical initiators Irgacure 2959 and Irgacure 907 were mixed in respective amounts of 1 part by weight and stirred for about 6 hr, thus preparing a curable emulsion composition.

(2) Formation of Wavelength Conversion Sheet

The coating composition was applied to a thickness of 80 μm on a first barrier film (i-Components, Korea) to form a coating layer.

A second barrier film, which is substantially the same as the first barrier film, was prepared, and the coating layer was covered with the second barrier film so as to come into contact therewith, and irradiated with UV light to cure the coating layer, thereby manufacturing a wavelength conversion sheet.

Comparative Example 3

(1) Photocurable Colloid Composition 5 g of polyethylene wax (Licowax PED 136, Clariant, Switzerland), as a wax-based compound, was mixed with 100 ml of toluene, after which the temperature was elevated to 110° C., so the wax-based compound was dissolved, thus preparing a wax solution. A solution in which 20 mg of CdSe quantum dots (Nanodot-HE, Ecoflux, Korea) were dispersed in 1 ml of toluene was added to the wax solution, mixed, and then cooled to room temperature, thus preparing a suspension in which encapsulated green quantum dots were dispersed.

The solution thus obtained was mixed with urethane acrylate available from BASF (Germany) and a photoinitiator (diphenyl(2,4,6-trimethylbenzoyl)phosphine oxide, TPO). TPO was mixed in an amount of 0.8 parts by weight based on 100 parts by weight of urethane acrylate. Thereafter, toluene was removed using an evaporator, thus preparing a coating composition in which the urethane acrylate, the encapsulated quantum dots and the photoinitiator were mixed.

Here, the coating composition contained 5 parts by weight of the encapsulated quantum dots based on 100 parts by weight of urethane acrylate.

(2) Formation of Wavelength Conversion Sheet

The coating composition in which the urethane acrylate, the encapsulated quantum dots and the photoinitiator were mixed was applied to a thickness of 80 μm on a first barrier film (i-Components, Korea), thus forming a coating layer.

A second barrier film, which is substantially the same as the first barrier film, was prepared, and the coating layer was covered with the second barrier film so as to come into contact therewith, and irradiated with UV light to cure the coating layer, thereby forming a wavelength conversion sheet.

Test Example 1

Evaluation of Dispersion Stability

The dispersion stability of the curable emulsion compositions prepared in Examples and Comparative Examples was measured as follows.

The dispersion stability was determined in a manner in which transmittance was measured (transmittance immediately after dispersion) immediately after preparing the curable emulsion compositions of Examples and Comparative Examples using a UV-visible spectrophotometer Cary-4000 (Agilent, USA), and was also measured (transmittance after 1 month) after allowing the same to stand at room temperature for 1 month, and the difference therebetween was calculated.

Transmittance difference (%)=transmittance immediately after dispersion (%)−transmittance after 1 month (%)     (Equation 1)

The transmittance difference is related to dispersion stability, and when dispersion stability is poor, precipitation occurs over time, thus increasing transmittance, and consequently, the transmittance difference is large. That is, the lower the transmittance difference, the higher the dispersion stability, and the higher the transmittance difference, the lower the dispersion stability.

TABLE 1

| No. | Transmittance difference (%) |
|---|---|
| Example 1 | 3% |
| Example 3 | 4% |
| Example 4 | 6% |
| Comparative Example 2 | 12% |

As is apparent from Table 1, the curable emulsion compositions of Examples 1, 3 and 4 according to the present invention exhibited low differences in transmittance, and thus there was almost no precipitation or aggregation over time, thereby demonstrating excellent dispersion stability. Compared thereto, the composition of Comparative Example 2 exhibited a transmittance difference about four times that of Example 1, indicating low dispersion stability.

Test Example 2

Dispersion of Encapsulated Quantum-Dot Particles

In order to evaluate the extent of dispersion of quantum dots in the wavelength conversion sheet, the wavelength conversion sheet manufactured in Example 1 was measured using a fluorescence microscope. The results thereof are shown in FIG. 16.

Figure 16:
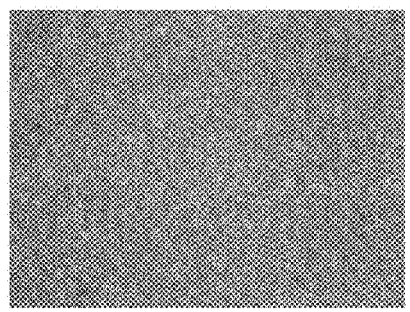
FIG. 16 shows a fluorescence microscope image of the wavelength conversion sheet manufactured in Example 1.

FIG. 16 shows a fluorescence microscope image of the wavelength conversion sheet manufactured in Example 1. With reference to FIG. 16, it can be seen that the quantum dots were uniformly distributed without aggregation in the direction of coating of the barrier film. Thereby, the wavelength conversion sheet manufactured according to the present invention exhibited substantially uniform optical properties over the entire sheet, that is, a wavelength conversion effect, resulting in excellent light conversion efficiency.

Test Example 3

Measurement of Quantum Yield

The quantum yield (QY) of the wavelength conversion sheets manufactured in Examples and Comparative Examples was measured using an absolute quantum yield spectrometer (C9920-02, HAMAMATSU, Japan). The measurement results thereof are shown in Table 2 below.

TABLE 2

| No. | Quantum yield (%) |
|---|---|
| Example 1 | 92% |
| Example 2 | 90% |
| Example 3 | 91% |
| Example 4 | 91% |
| Comparative Example 1 | 88% |
| Comparative Example 2 | 86% |
| Comparative Example 3 | 82% |

As is apparent from Table 2, the quantum yield of the wavelength conversion sheets manufactured according to the present invention was high compared to the wavelength conversion sheets of Comparative Examples 1 to 3.

The quantum yield is related to compatibility between the matrix and the quantum dots. When the quantum dots in the matrix are aggregated, a quenching effect is caused by the aggregation phenomenon, undesirably lowering the quantum yield. The low quantum yield decreases color purity, making it difficult to realize a desired color upon application to a display. Therefore, the wavelength conversion sheets manufactured in Examples 1 to 4 according to the present invention can exhibit a high quantum yield of 90% or more because the quantum dots are uniformly distributed throughout the matrix without aggregation, and can achieve high color purity when applied to a display.

Test Example 4

Measurement of Edge Ingress (Quenching Effect)

The wavelength conversion sheets manufactured in Examples and Comparative Examples was measured for resistance to oxygen and moisture.

In the wavelength conversion sheet, the quantum dots are oxidized by oxygen and moisture; in particular, the edge portion is oxidized, which leads to deterioration of optical properties (edge ingress). Accordingly, the wavelength conversion sheet was photographed after being allowed to stand for 42 days under conditions of 65° C. and 95% relative humidity. The results thereof are shown in FIG. 17.

Figure 17:
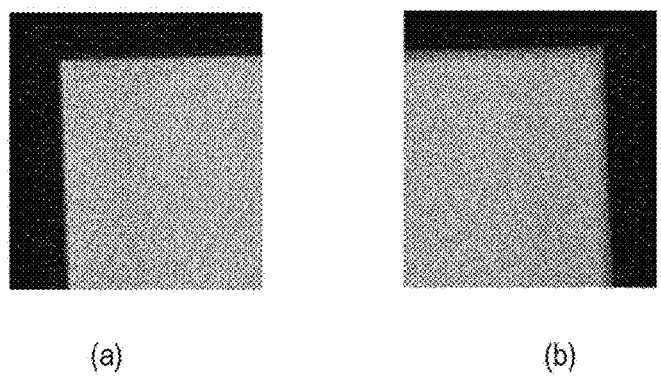
FIG. 17(a) shows a photograph of the wavelength conversion sheet of Example 1.
FIG. 17(b) shows a photograph of the wavelength conversion sheet of Comparative Example 1.

FIG. 17(a) shows a photograph of the wavelength conversion sheet of Example 1, and FIG. 17(b) shows a photograph of the wavelength conversion sheet of Comparative Example 1. As shown in FIG. 17, in the wavelength conversion sheet of Comparative Example 1, a quenching phenomenon of 2.5 mm or more occurred at the edge portion, whereas no quenching phenomenon occurred in the wavelength conversion sheet of Example 1. The method of manufacturing the wavelength conversion sheet according to the present invention is very effective at blocking moisture and oxygen capable of contacting quantum dots, making it possible to maintain stable light emission properties.

These results are caused by multiple factors, such as effective blockage of oxygen and moisture from the outside due to the use of the encapsulation resin having hydrophobic properties according to the present invention, no separation between the matrix and the encapsulation resin, and strong adhesion of the matrix material to the barrier film.

Test Example 5

Measurement of Optical Properties and Light Conversion Efficiency

The color properties, optical properties and light conversion efficiency of the wavelength conversion sheets manufactured in Examples and Comparative Examples were measured.

(1) Optical Properties

In a display configured such that a wavelength conversion sheet was disposed on a light-emitting diode package including a blue-light-emitting diode and such that two films including a luminance enhancement film (BEF, 3M) and a reflective polarizer film (DBEF, 3M) were disposed on the wavelength conversion sheet, CIE 1931 color coordinates and luminance were measured using a spectroradiometer (CS-2000, KONICA MINOLTA, Japan).

(2) Light Conversion Efficiency

The ratio of the number of photons of emitted light to the number of photons of light absorbed by the wavelength conversion sheet by projecting 420 nm excitation light was calculated and measured using an absolute quantum yield spectrometer.

The results of measurement of optical properties and light conversion efficiency are shown in Table 3 below.

TABLE 3

| No. | Color coordinates CIE 1931 (x, y) | Luminance (nit) | Light conversion efficiency |
| --- | --- | --- | --- |
| Example 1 | (0.2232, 0.2097) | 8846 | 69% |
| Example 2 | (0.2240, 0.2093) | 8763 | 65% |
| Example 3 | (0.2246, 0.2091) | 8754 | 64% |
| Example 4 | (0.2243, 0.2087) | 8789 | 66% |
| Comparative Example 1 | (0.2145, 0.1981) | 7542 | 58% |
| Comparative Example 2 | (0.2192, 0.2037) | 7498 | 55% |
| Comparative Example 3 | (0.2038, 0.2117) | 7481 | 54% |

As is apparent from Table 3, when the wavelength conversion sheet of each of Examples 1 to 4 according to the present invention was mounted, the light conversion efficiency was measured to be 64% to 66%, which is evaluated to be high compared to the sheets of Comparative Examples 1 to 3. When the light conversion efficiency was higher, the luminance and also CIE 1931 color coordinates were increased.

Specifically, in the wavelength conversion sheets of Comparative Examples 1 to 3, the dispersion of quantum dots in the matrix was not uniform, and oxidation of quantum dots due to moisture and oxygen from the outside occurred. Moreover, as light was reabsorbed between the quantum dots, the light conversion efficiency was lowered, resulting in decreased luminance. Furthermore, the color coordinates thereof were different from those of Examples 1 to 4, making it impossible to sufficiently exhibit a desired color.

INDUSTRIAL APPLICABILITY

A quantum-dot film and a wavelength conversion sheet including the same according to the present invention are applicable to a display.

The invention claimed is:

1. A method of manufacturing a quantum-dot film, suitable for manufacturing a quantum-dot film in which encapsulated particles obtained by encapsulating quantum dots with an encapsulation resin are dispersed in a matrix resin, the method comprising sequential steps of:

(a) preparing a curable emulsion composition comprising an inner phase, comprising an encapsulation resin in liquid state and quantum dots dispersed in the encapsulation resin, and an outer phase in liquid state, comprising a photocurable polymerization compound and a photoinitiator, the inner phase being dispersed in a droplet form in the outer phase; and then (b) independently performing encapsulation of the inner phase and curing of the outer phase using the curable emulsion composition, wherein the encapsulation resin is a thermally curable resin or a wax-based compound, and wherein the step (b) is performed in a manner in which the inner phase is first cured or solidified and then the outer phase is cured, or the outer phase is first cured and then the inner phase is cured or solidified.

2. The method of claim 1, wherein the encapsulation resin is a thermally curable resin, and the quantum dots of the inner phase are encapsulated with the encapsulation resin by applying heat, and then the photocurable polymerization compound of the outer phase is cured through light irradiation.

3. The method of claim 1, wherein the encapsulation resin is a thermally curable resin, and the photocurable polymerization compound of the outer phase is cured through light irradiation, and then the quantum dots of the inner phase are encapsulated with the encapsulation resin by applying heat.

4. The method of claim 1, wherein the encapsulation resin is a wax-based compound, and a temperature of the curable emulsion composition is lowered to a temperature equal to or lower than a melting point of the wax-based compound so that the quantum dots of the inner phase are encapsulated with the encapsulation resin, and the photocurable polymerization compound of the outer phase is cured through light irradiation.

5. The method of claim 4, wherein the curable emulsion composition is prepared in a manner in which the quantum dots and the encapsulation resin are mixed at a temperature equal to or higher than the melting point of the wax-based compound to afford an inner phase, and the inner phase and the outer phase are mixed at a temperature equal to or higher than the melting point of the wax-based compound.

6. The method of claim 1, wherein the thermally curable resin is a liquid resin that remains liquid at room temperature.

7. The method of claim 1, wherein the thermally curable resin comprises at least one selected from the group consisting of a silicone-based resin, an epoxy resin, a petroleum resin, a phenol resin, a urea resin, a melamine resin, an unsaturated polyester resin, an amino resin, butyl rubber, isobutylene rubber, acrylic rubber, and urethane rubber.

8. The method of claim 1, wherein the wax-based compound is at least one selected from the group consisting of petroleum wax, natural animal wax, natural vegetable wax, and synthetic wax.

9. The method of claim 1, wherein the photocurable polymerization compound is any one selected from the group consisting of an acrylic oligomer, an acrylic monomer and combinations thereof.

10. The method of claim 1, wherein the photoinitiator is at least one selected from the group consisting of a benzoin photoinitiator, a hydroxyketone photoinitiator, an aminoketone photoinitiator, and a phosphine oxide photoinitiator.

11. The method of claim 1, wherein at least one of the inner phase and the outer phase in the curable emulsion composition further comprises any one selected from the group consisting of ceramic nanoparticles, a crosslinking agent, a catalyst, a surfactant, and a solvent.

12. The method of claim 11, wherein the ceramic nanoparticles are at least one selected from the group consisting of silica, alumina, titania, zirconia, tungsten oxide, zinc oxide, and Si3N4.

13. The method of claim 1, wherein the quantum dots are further subjected to primary coating with any one encapsulation resin selected from among a thermally curable resin and a wax-based compound.

* * * * *